United States Patent [19]

Fukaya et al.

[11] Patent Number: 4,700,080
[45] Date of Patent: Oct. 13, 1987

[54] COLOR PHOTOSENSOR UTILIZING COLOR FILTERS

[75] Inventors: Masaki Fukaya; Toshiyuki Komatsu; Tatsumi Shoji; Masaru Kamio; Nobuyuki Sekimura, all of Kanagawa, Japan

[73] Assignee: Canon Kabushiki Kaisha, Tokyo, Japan

[21] Appl. No.: 20,145

[22] Filed: Feb. 25, 1987

Related U.S. Application Data

[63] Continuation-in-part of Ser. No. 758,384, Jul. 24, 1985, abandoned.

[30] Foreign Application Priority Data

Jul. 31, 1984 [JP] Japan .................................. 59-158661
Aug. 1, 1984 [JP] Japan .................................. 59-160269

[51] Int. Cl.$^4$ ............................................. G02B 5/20
[52] U.S. Cl. ...................................... 250/578; 350/311
[58] Field of Search ................... 250/211 R, 226, 578; 350/311, 317; 357/30-32; 358/212, 213

[56] References Cited

U.S. PATENT DOCUMENTS 4,600,833 7/1986 Shibata et al. .................... 350/311

Primary Examiner—David C. Nelms
Assistant Examiner—Stephone B. Allen
Attorney, Agent, or Firm—Fitzpatrick, Cella, Harper & Scinto

[57] ABSTRACT

A color photosensor which includes a plurality of closely arranged sensor units. Each sensor includes a color filter provided at a position corresponding to that of a photoreceptor. The color filter comprises at least one of coloring matter layers selected from the following groups (A), (B) and (C):

(A) A red coloring matter layer including, as a main component, perylenetetracarboxylic acid derivatives selected from the following structural formulas (I) and (II):

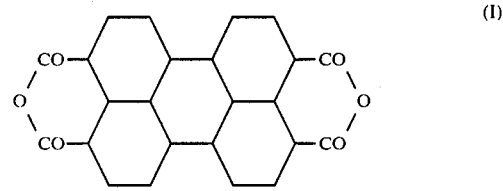

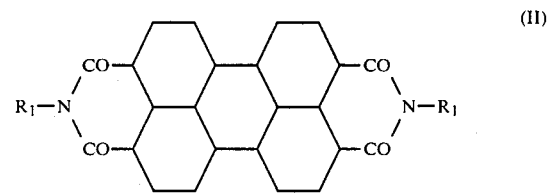

where $R_1$ denotes hydrogen, an alkyl group or an allyl group;

(B) a green coloring matter layer including, as a main component, phthalocyanine coloring matter, a combination of phthalocyanine coloring matter and isoindolenone coloring matter, or a combination of phthalocyanine coloring matter and authraquinone coloring matter; and (C) a blue coloring matter layer including, as a main component, phthalocyanine coloring matter, or a combination of phthalocyanine coloring matter and quinacridon coloring matter.

6 Claims, 19 Drawing Figures

COLOR PHOTOSENSOR UTILIZING COLOR FILTERS

This application is a continuation of application Ser. No. 758,384 filed July 24, 1985, abandoned.

BACKGROUND OF THE INVENTION

1. Field of the Invention

The present invention relates to a photosensor, and more particularly to a color photosensor for reading a color image.

2. Description of the Prior Art

Conventionally, in a photoelectric conversion apparatus used as an optical input unit of an image data processing apparatus such as a facsimile device, a digital reproduction device or a character reader, it is well known to use a photosensor as a photoelectric conversion element. Especially, a strip line sensor which includes a one-dimensional array of photosensor is recently used to constitute part of a highly sensitive image processing apparatus.

As an example of one of the photosensors which constitute a strip line sensor, a planar photoelectric photosensor could be named which includes a photosensitive layer which may be made of charcogenide, CdS, CdSSe, amorphous silicon (referred to as a-Si hereinafter) or the like, and a pair of opposing metal electrodes disposed on the layer to form a gap which functions as a photoreceptor.

Planar photoelectric photosensors each comprising a-Si, especially the a-Si which includes hydrogen atoms and/or halogen atoms (fluorine, chlorine or the like), referred to as a-Si(H,X) hereinafter, have high optical response speeds and provide large output photocurrents, thereby constituting an excellent one-dimensional photosensor array. The a-Si(H,X) materials are unpollutant and very productive because silicon technology such as plasma CVD technique or photolithopatterning technique can be adopted.

In addition, as shown in FIG. 19, a-Si(H,X) photosensors are characterized in that their spectral sensitivity is close to spectral luminous efficiency so that they are very suitable for color photosensors. More particularly, the spectral sensitivity of the a-Si(H,X) photosensors is flat. That is when the photosensors are irradiated with 450 nm blue light, 550 nm green light, and 650 nm red light, each having the same energy of 10 $\mu$W/cm$^2$, they provide output photocurrents 2, 3.5 and 3, respectively. Thus they are very suitable for color photosensors.

In order to provide such a color photosensor, a color filter and a photosensor can be separately formed and then stuck together. Alternatively, a color filter can be provided directly on a photoelectric section. In the former method, respective color elements of the filter and photoelectric conversion elements of the photosensor are required to be registered precisely with each other, so that it is difficult to apply this method to a strip line sensor or the like. On the other hand, in the latter method, if a color filter is provided directly on a photoconductive conversion section, no precise register is required to stick the respective color elements of the color filter and the photoelectric conversion section of the photosensor. This method can be effected in the same photoprocess and also applied satisfactorily to the construction of a strip line sensor or the like.

A color filter used in such a color photosensor must have enough durability to light and heat due to incident light.

The color filter is formed in part of the process of forming the photosensor. Thus, the filter forming process is required which does not influence the characteristics of the a-Si photoconductive layer. An additional requisite for the color filter is that a highly accurate filter pattern can be formed on a rugged photosensor surface.

As a conventional color filter, a dyeing color filter is known which includes mordanting layer made of a hydrophilic macromolecule material which may include gelatin, casein, glue or polyvinyl alcohol, the mordanting layer being dyed with coloring matter. In this dyeing method, many dyestuffs are usable and accommodation to the spectral characteristic required of the filter is relatively easy. The dyeing step includes a hard-to-control step of dipping the mordanting layer into a dyeing bath in which a dyestuff is dissolved. In addition, a complicated step of providing an intermediate resist printing layer for each color is included, thereby resulting in a low yield. The heat resistance of the filter materials is relatively low, i.e., 150°-160° C., so that the filter materials cannot be used in the steps in which heat treatment is required.

A dyeing process including a wet treatment adversely affects the characteristics of amorphous silicon and is unrecommendable. Furthermore, it is difficult to form a highly accurate pattern on a rugged surface.

In contrast, an evaporation method is known which forms a coloring matter film of a dyestuff or pigment using a gas phase evaporation method which includes a vapor deposit step, etc. (Japanese Unexamined Patent Publication (Kokai) No. 146406/1980 etc.). This method includes the steps of evaporating a color material into a film, forming a mask with a resist and forming a color element by the wet etching which includes patterning the color material, which constitutes the film, with a solvent which selectively dissolves the color material, or the dry etching which includes ashing the color material with gaseous plasma ions. These steps are repeated for a required number of color filter color elements through corresponding transparent protective films, which protect photosensors and already formed color elements from being etched. In the wet etching method, it is difficult to select a solvent to dissolve only the color material without affecting the resist mask. It is also difficult to prevent etching of the color material which underlies the resist mask due to utilization of dissolution of the color material, thereby rendering it difficult to obtain minute shapes. These drawbacks are not found in the dry etching method.

However, when the evaporation film is patterned by dry etching, the film as well as the resist mask are removed simultaneously. Thus, the resist mask must be considerably thick, thereby degrading the accuracy of the resulting pattern. One transparent intermediate protective film is needed each time a single color element is formed so as not to damage the photosensor itself and color elements of the color filter already patterned by the dry etching. The presence of this protective film and the resist mask decreases the transmission factor of the filter, thereby increasing flare light energy. In addition, although the color material film itself has an excellent thermal resistance because it is formed by evaporation, the whole color filter has a degraded thermal resistance because the intermediate protective film and resist mask have degraded thermal resistance.

An a-Si(H,X) forming method which forms the photoconductive layer of the sensor unit of a color photosensor such as described above includes plasma CVD method, reactive sputtering method, or ion plating method. Each of these methods uses a glow discharge to expedite the reaction. However, in order to obtain an excellent a-Si(H,X) film having a high photoconductivity using any one of the methods, the film must be formed with relatively low discharge power. However, the photoconductive layer obtained by formation of the film with such low discharge power is not fully adhered to a substrate made of a glass or ceramic material, and the film is likely to be peeled off when the photoconductive layer is subjected to a subsequent photolithography step, etc., for formation of the electrodes.

In order to prevent the film from being peeled off, a method is conventionally employed which includes roughening a substrate surface and thereafter depositing an a-Si substance on the roughened substrate surface. That is, the substrate surface is in advance etched chemically with hydrofluoric acid, for example, or otherwide scratched physically with a brush, for example. However, such method has the following drawbacks:

(1) A system associated with the washing line has a complicated structure and is expensive when a chemical such as hydrofluoride is used;

(2) It is difficult to control the degree of a ruggedness on the substrate surface;

(3) Microscopic defects are likely to occur at the substrate surface when this surface is roughened.

The characteristics of an a-Si film deposited on the microscopic defects and hence the characteristics of the resulting photoconductive layer are likely to vary from place to place. Therefore, when a color photosensor is formed with photosensor units having such a-Si(H,X) films, since the characteristics of the sensor units differ from each other, a correction circuit must be additionally provided which accommodates a discrepancy between the characteristics of the photosensor units in order to obtain an appropriate color signal.

SUMMARY OF THE INVENTION

In view of the above prior art, it is an object of the present invention to provide a color photosensor of high performance.

It is another object of the present invention to provide an inexpensive color photosensor which can maintain high performance for a long period of time and has a decreased discrepancy between the characteristics of the photosensor units.

Still another object of the present invention is to provide a color photosensor which includes a plurality of closely arranged sensor units, the number of which is equal to the number of signals into which a color signal is decomposed, each sensor unit including a photoconductive layer which contains amorphous silicon formed on a substrate, a pair of electrodes in electrical contact with the photoconductive layer, a photoreceptor, and a color filter provided at a position corresponding to that of the photoreceptor, the color filter comprising at least one of coloring matter layers selected from the following groups (A), (B) and (C):

(A) a red coloring matter layer including, as a main component, perylenetetracarboxylic acid derivative selected from the following structural formulas (I) and (II):

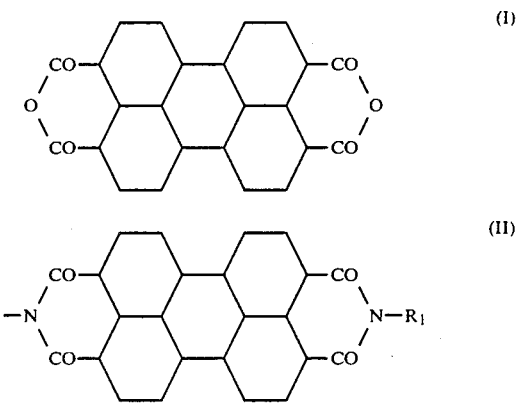

where $R_1$ denotes hydrogen, an alkyl group or an allyl group.

(B) a green coloring matter layer including, as a main component, phthalocyanine coloring matter, a combination of phthalocyanine coloring matter and isoindolenone coloring matter, or a combination of phthalocyanine coloring matter and anthraquinone coloring matter; and (C) a blue coloring matter layer including, as a main component, phthalocyanine coloring matter, or a combination of phthalocyanine coloring matter and quinacridon coloring matter.

A further object of the present invention is to provide a color photosensor which includes a plurality of closely arranged sensor units, the number of which is equal to the number of signals into which a signal is decomposed, each sensor unit including a photoconductive layer which contains amorphous silicon formed on a substrate, a pair of electrodes in electrical contact with the photoconductive layer, a photoreceptor, and a color filter of a coloring matter layer formed by evaporation at a position corresponding to that of the photoreceptor, the photoconductive layer of each sensor unit including a multilayered film of two or more layers which are different in refractive index, the undermost layer of the multilayered film having a refractive indexs of 3.2 or less for light having a wavelength of 6328 Å.

DETAILED DESCRIPTION OF PREFERRED EMBODIMENT

Now an embodiment of the present invention will be described.

In this specification, the undermost layer of the multi-layered photoconductive layer can be referred to as underlying a-Si(H,X) hereinafter and one or more layers overlying the undermost layer can be referred to as overlying a-Si(H,X) layer(s) hereinafter.

Figure 1:
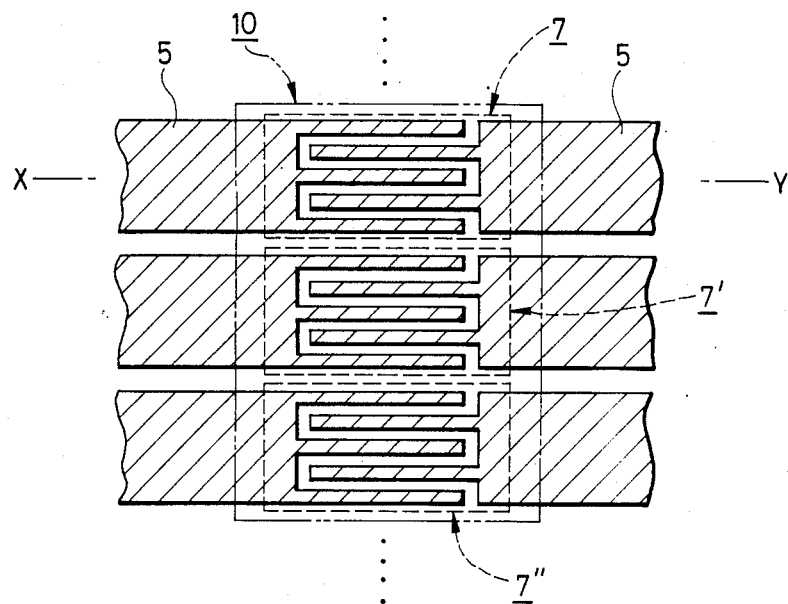
FIG. 1 is a plan view of a color photosensor according to the present invention.
Figure 2:
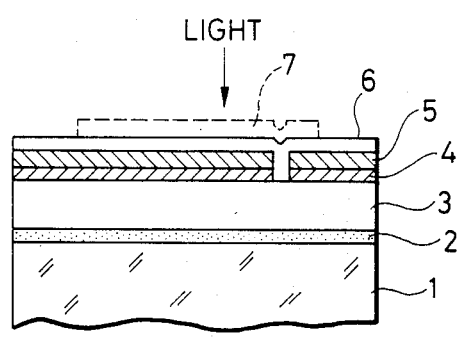
FIG. 2 is a cross-sectional view taken along a line X-Y of FIG. 1.

FIG. 1 is a partial plan view of an embodiment of a color photosensor array which includes arranged color photosensors. FIG. 2 is a cross-sectional view taken along a line X-Y of FIG. 1. In FIGS. 1 and 2, reference numeral 1 denotes a substrate. Reference numeral 2 denotes the underlying a-Si(H,X) layer. Reference numeral 3 denotes the overlying a-Si(H,X) layer. The underlying and overlying layers constitute a photoconductive layer. Reference numeral 4 denotes an n+ layer which includes an ohmic contact layer. Reference numeral 5 denotes conductive layers or electrodes. Reference numeral 6 denotes a protective layer. Reference numeral 7 denotes a color filter.

As the substrate 1, corning glasses #7059 and #7740 manufactured by Corning Glass Works Co., Ltd., SGC glass manufactured by TOKYO OHKA KOGYO CO., LTD., glass such as silicon glass, or ceramics such as partially glazed ceramics or the like may be used.

The photoconductive layer is made of an amorphous material including a-Si(H,X) as a main component. The underlying a-Si(H,X) layer 2 preferably has a refractive index of 3.2 or smaller. The overlying a-Si(H,X) layer 3 has a refractive index of 3.2 or larger, preferably of the order of 3.4. The photoconductive layer is formed by plasma CVD method, reactive sputtering method or ion plating method, especially by the plasma CVD method. A stress occurs in the resulting photoconductive layer due to hydrogen taken in when the photoconductive layer is formed. If the stress is too large, the adhesion of the photoconductive layer to the substrate is deteriorated and the film is likely to be peeled off. The magnitude of the stress in the photoconductive layer can be controlled by setting the layer forming conditions such as, for example, the discharge power of glow discharge, the substrate temperature, the composition and pressure of a source gas used to respective appropriate values. As the underlying a-Si(H,X) layer 2 adjoining substrate 1, a small-stressed layer can be formed, for example, by execution of glow discharge having relatively large power, thereby keeping good adhesion to substrate 1.

It is known that a stress in the photoconductive layer is correlated greatly with the refractive index of the layer. Generally when the stress is small, the refractive index is known to be small. It is also known that execution of glow discharge with relatively lower discharge power is required in order that the photoconductive layer has an excellent photoconductivity. Thus, preferably, glow discharge is performed with relatively high-power over substrate 1 to form the underlying a-Si(H,X) layer 2 having a relatively small refrax index, for example, of 3.2 or smaller, and second glow discharge is then performed with relatively low power to form an overlying high-photoconductivity a-Si layer 3 having a relatively large refrax index, for example, of the order of 3.4. The electrodes 5 may include a conductive film, for example, of aluminium or the like. The protective layer 6 may include an insulating inorganic film of Si:N:H or the like, or one of various insulating organic resin films.

The color filter 7 includes a thin film formed by evaporation of coloring matter of a thermally stable sublimable pigment. Examples of such coloring matter for the filter formation are acetoacetic anilide, naphtol type monoazo, polycyclic, dispersion system, oil soluble, indanthrene, or phthalocyanine color matter. Especially, as preferred color matter, phthalocyanine, perylen, isoindolenone, anthraquinone, and quinacridon coloring matter are named. Typical coloring matter will be exemplified as follows:

Examples of phthalocyanine color matter are metal-free phthalocyanine, copper phthalocyanine, beryllium phthalocyanine, magnesium phthalocyanine, zinc phthalocyanine, titanium phthalocyanine, tin phthalocyanine, lead phthalocyanine, vanadium phthalocyanine, cromium phthalocyanine, molybdenum phthalocyanine, manganese phthalocyanine, iron phthalocyanine, cobalt phthalocyanine, nickel phthalocyanine, palladium phthalocyanine, and platinum phthalocyanine.

As perylen coloring matter, perylenetetracarboxylic acid derivatives are preferable, and named as follows (they are shown by signs ①-⑧):

①
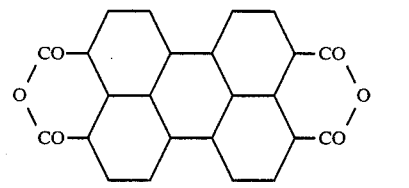
(3,4,9,10-perylenetetracarboxylic acid = anhydride)

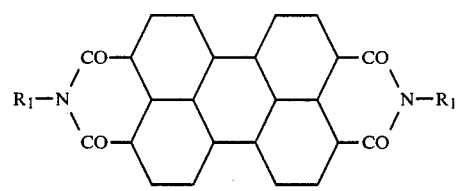

② The above formula where $R_1$ is —H.
③ The above formula where $R_1$ is —$CH_3$.

④
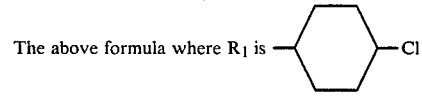
The above formula where $R_1$ is —⬡—Cl

⑤
The above formula where $R_1$ is
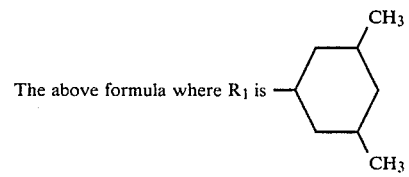

⑥
The above formula where $R_1$ is
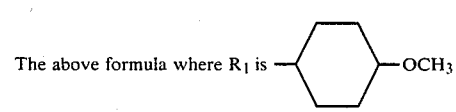

⑦ The above formula where R₁ is 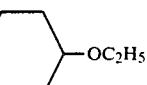

⑧ The above formula where R₁ is

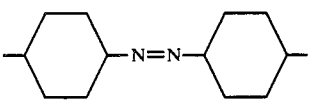

However, it should be noted that perylenetetracarboxylic acid derivatives are not necessarily limited to these named ones.

The following example of commercially available perylenetetracarboxylic acid derivatives (Trade names):

PALIOGEN Red L 3870 HD (manufactured by BASF) C.I. No. 71145

PALIOGEN Red L 3880 HD (manufactured by BASF)

MOVOPERM Red BL (manufactured by HOECHST PHARMACEUTICALS) C.I. No. 71137

PERRINDO Maroon R6434 (manufactured by BAYER) C.I. No. 71130

PERRINDO Red R6418 (manufactured by BAYER)

HELIO FAST Marron E3R (manufactured by BAYER)

KAYASET Scarlet E-2R (manufactured by NIPPON KAYAKU)

KAYASET BORDEAUX E-D (manufactured by NIPPON KAYAKU)

IRGAZIN Red BPT (manufactured by CIBA-GEIGY A.G.) C.I. No. 71127

Isoindolenone color matter have aromatic condensed polycyclic structures, represented basically by the formulas below:

The isoindolenone color matter may include ones in which the 4th, 5th, 6th and 7th positions each are not replaced with a chroline atom. However, in terms of light and solvent resistance, they should preferably include ones in which the above-mentioned positions each are replaced with a chroline atom.

The color can vary from yellow through orange to red brown depending on the structure of R in the formula. Especially, the yellow coloring matter is excellent in terms of colorfulness and sharp spectral characteristic.

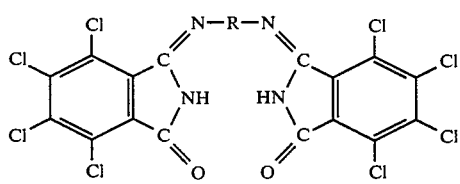

Typical example of isoindolenone coloring matter are one wherein R in the above formula takes the following:

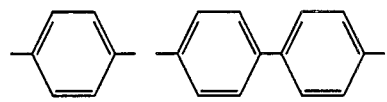

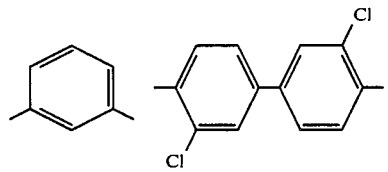

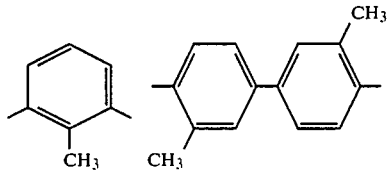

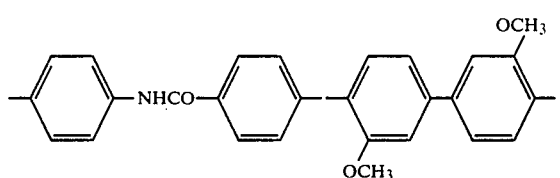

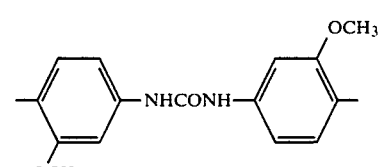

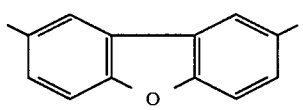

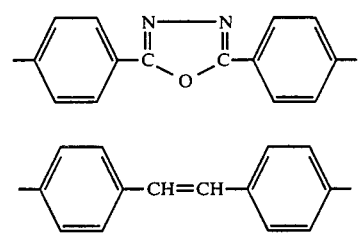

However, the isoindolenone coloring matter are not necessarily limited to these named ones. As such isoindolenone coloring matter commercially available, the following are named:

IRGAZIN Yellow 2GLT, 2GLTE, 2GLTN (manufactured by CIBA-GEIGY A.G.)

LIONOGEN Yellow 3GX (manufactured by TOYO INK MFG.)

FASTOGEM SUPER Yellow GR, GRO, GROH (manufactured by DAINIPPPON INK & CHEMICALS)

IRGAZIN Yellow 2RLT, 3RLT, 3RLTN (manufactured by CIBA-GEIGY A.G.)

LIONOGEN Yellow RX (manufactured by TOYO INK MFG.)

LITHOLFAST Yellow 1840 (manufactured by BASF)

KAYASET Yellow E-2RL, E-3RL176 (manufactured by NIPPON KAYAKU)

CROMOPHTAL Orange 2G (manufactured by CIBA-GEIGY A.G.)

IRGAZIN Red 2BLT (manufactured by CIBA-GEIGY A.G.)
The anthraquinone coloring matter includes anthraquinone derivatives and similar quinones.
Examples of the structures of typical anthraquinone yellow coloring matter are:
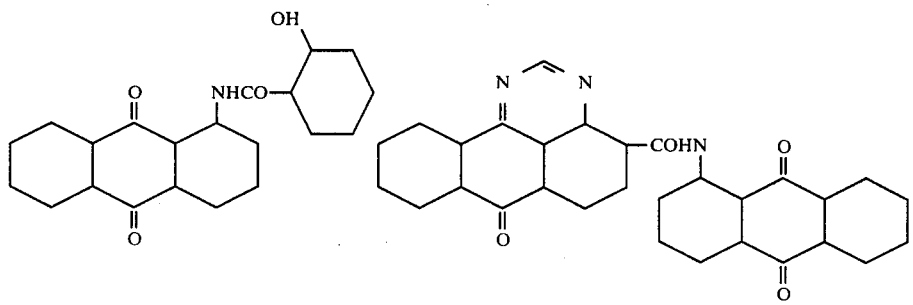
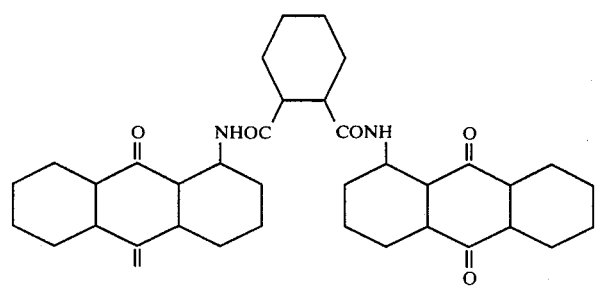
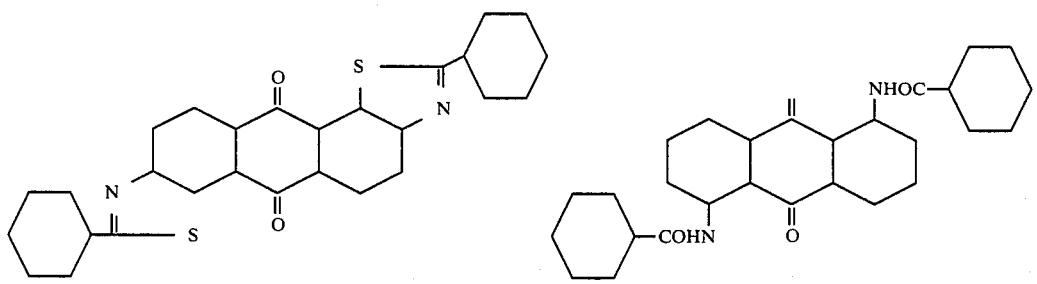
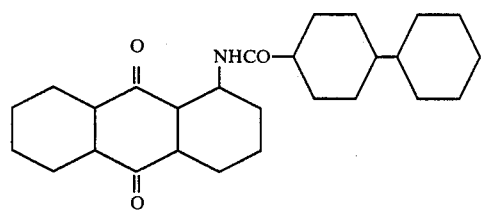
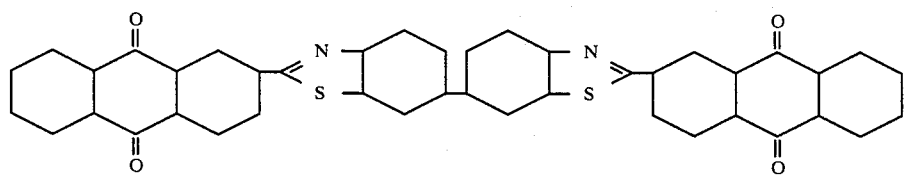
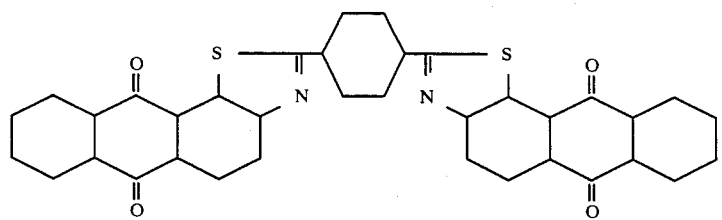

-continued
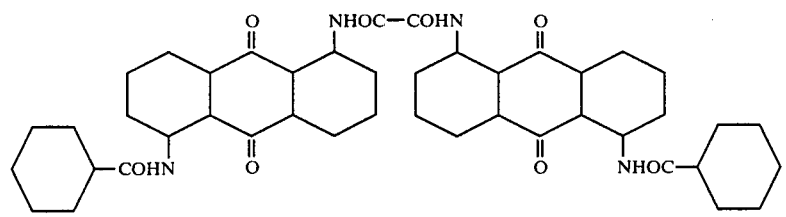
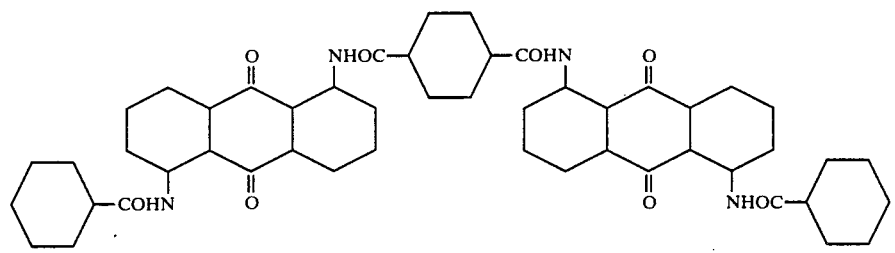
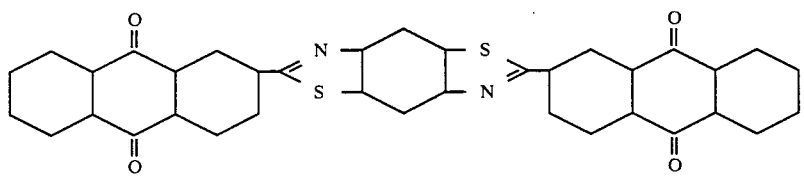
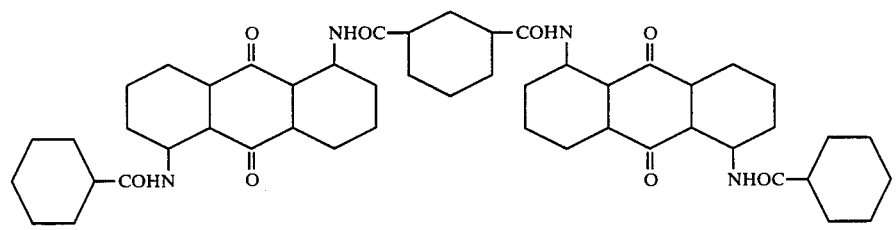
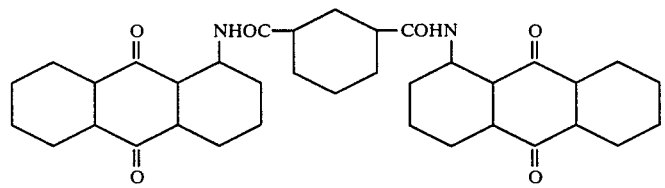
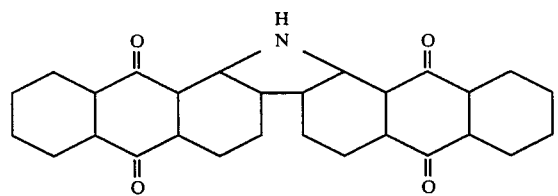
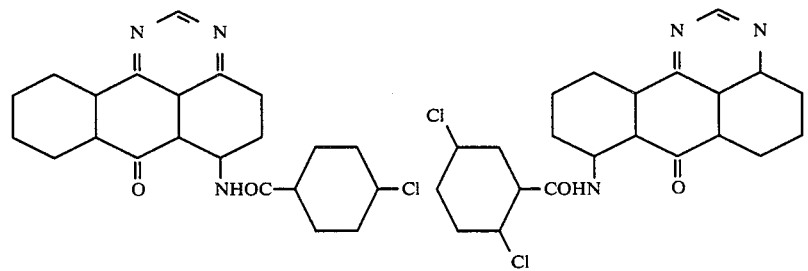

-continued

However, it should be noted that the anthraquinone coloring matter are not necessarily limited to these exemplified ones.

As such anthraquinone coloring matter, the following are commercially available:

CROMOPHTAL Yellow A2R (manufactured by CIBA-GEIGY A.G.) C.I. No. 70600

HELIO FAST Yellow E3R (manufactured by BAYER)

PALIOGEN Yellow L1560 (manufactured by BASF) C.I. No. 68420

KAYASET Yellow E-R (manufactured by NIPPON KAYAKU) C.I. No. 65049

CROMOPHTAL Yellow AGR (manufactured by CIBA-GEIGY A.G.)

BAYPLAST Yellow E2G (manufactured by BAYER)

NIHONTHREN Yellow GCN (manufactured by SUMITOMO CHEMICAL) C.I. No. 67300

MIKETHREN Yellow GK (manufactured by MITSUITOATSU CHEMICAL) C.I. No. 61725

INDANTHREN PRINTING Yellow GOK (manufactured by HOECHST PHARMACEUTICALS) C.I. No. 59100

ANTHRASOL Yellow V (manufactured by HOECHST PHARMACEUTICALS) C.I. No. 60531

MIKETHREN SOLUBLE Yellow 12G (manufactured by MITSUITOATSU CHEMICAL) C.I. No. 60605

MIKETHREN Yellow GF (manufactured by MITSUITOATSU CHEMICAL) C.I. No. 66510

NIHONTHRENE Yellow GGF (manufactured by SUMITOMO CHEMICAL) C.I. No. 65430

INDANTHREN Yellow 3G (manufactured by BAYER) C.I. No. 65405

INDANTHREN Yellow 5GK (manufactured by BAYER) C.I. No. 65410

NIHONTHRENE Yellow 4GL (manufactured by SUMITOMO CHEMICAL)

PALANTHREN Yellow PGA (manufactured by BASF) C.I. No. 68400

CIBANON(E) Yellow 2G (Manufactured by CIBA-GEIGY A.G.)

INDANTHREN Yellow F2GC (manufactured by HOECHST PHARMACEUTICALS)

ANTHRASOL Yellow IGG (manufactured by HOECHST PHARMACEUTICALS)

INDANTHREN Yellow 5GF (manufactured by BASF)

MIKETHREN Yellow 3GL (manufactured by MITSUITOATSU CHEMICAL)

INDANTHREN Yellow LGF (manufactured by BASF)

MONOLITE Yellow FR (manufactured by ICI)

KAYASET Yellow E-AR (manufactured by NIPPON KAYAKU)

As the blue coloring matter phthalocyanine coloring matter or a combination of phthalocyanine and quinacridon coloring matter is named as preferred examples.

The phthalocyanine coloring matter are mentioned above. The quinacridon coloring matter have a basic framework shown by the following formula (I) and the framework and derivatives thereof are shown below:

Examples of the derivatives are:

The quinacridon coloring matter may include a mixture of the above derivatives. Each of these coloring matter has an excellent Magenta spectral characteristic.

As specified coloring matter, the following (trade name) are named:

LIONOGEN Magenta R (by TOYO INK MFG.)

FASTOGEN SUPER Magenta R. RS (by DAINIPPON INK & CHEMICALS)

CINQUASIA Red BRT. YRT (by Du PONT)

CINQUASIA Violet BRT (by Du PONT)

In vapor deposit or evaporation of such coloring matter, either a mask having a desired pattern is in advance disposed on protective layer 6, or selective heating is performed, to form coloring matter layers on desired portions of protective layer 6, thereby forming filter 7. Alternatively, uniform evaporation is effected temporally on the entire surface of protective layer 6, and then the coloring matter layer on unnecessary portions is removed using photolithography technique, for example, dry etching, thereby forming filters 7 on the desired portions of protective layer 6.

For the purpose of color reading, an R filter 7, a G filter 7' and B filter 7" are provided respectively on photoreceptors of 3 serial photosensors to form a single pixel 10 as shown in FIG. 1. The photosensor array includes a plurality of serial such pixels 10.

A color filter used in another embodiment of a color photosensor according to the present invention may be formed, for example, as a patterned coloring matter layer using lift-off method after evaporation of the coloring matter. According to this method, a resist mask is formed under a coloring matter layer to be removed using a material which can be melted later, mainly resist. An evaporation coloring matter layer is then formed on the resist mask. The resist mask is then dissolved or peeled off thereby to remove the coloring matter layer physically and hence to form a pattern. Therefore, in the patterning, etching the color material layers is unnecessary and there is no probability that the photosensors and already formed color elements will be further eroded, so that no intermediate protective layer is needed. Thus, since the color elements include only color material films, they can be formed on the same plane. Consequently, there is no absorption and reflection of light by the intermediate protective layer and/or resist mask and the transmitted light energy is not decreased. The resulting color filter include no intermediate protective layer and resist mask which have low thermal resistance, and has an excellent thermal resistance.

The color filter in the preferred embodiment of the photosensor according to the present invention includes a pigment as a main component and has excellent light resistance. In another preferred embodiment, a color material is evaporated into a film, so that even if the surfaces of the photosensors, subjected to evaporation, are rugged, color material films are formed parallel to the rugged photosensor surfaces. Thus the spectral characteristic does not vary from place to place. The process used involves formation of a pattern with a resist in photolithography, so that a highly accurate filter is formed easily.

The color materials used for evaporation should be sublimable or evaporable coloring matter and insoluble in a solvent used for dissolution of the resist mask. The coloring matter which satisfies these requirements are selected as needed from the above-mentioned ones.

The resist used for the resist mask does not care whether it is negative acting one or positive if it becomes dissoluble later. However, in the negative resist, bridge formation will be generally expedited with irradiation of a radiation and a solvent which can dissolve the resist greatly is needed for that purpose. However, this powerful solvent is not desirable because it is likely to damage or dissolve the coloring matter layer.

In contrast, in a positive type or acting resist, especially after formation of a resist pattern, the pattern resist becomes soluble if it is irradiated with radiant rays, so that a solvent which cannot dissolve the coloring matter so easily compared to a negative acting resist can be selected. Thus the positive resist is preferable for lift-off. There are various kinds of resin components of the positive resist and various kinds of solvents used for coating and developing the positive resist. It is desirable to select a positive resist in conjunction with which a solvent not so active on the coloring matter can be used. One preferable example is a positive type resist which mainly includes fluorine-containing methacrylate having a structure shown below as a polymerization unit. This resist is well soluble in highly dissoluble solvents such as esters, aromatic compounds, or halogenated hydrocarbons, as well as in poorly dissoluble solvents such as alcohol. Thus in conjunction with this photoresist, a solvent which does not affect the coloring matter film so greatly can be used.

As examples of such resist, "FPM210", "FBM110" and "FBM120" (trade name) manufactured by Daikin Kogyo Co., Ltd. are named:

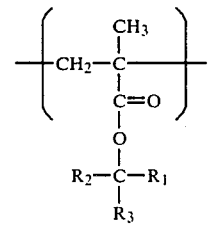

where $R_1$ and $R_2$ are hydrogen or an alkyl group and $R_3$ is an alkyl group which contains carbon atoms, each of which is coupled to at least one fluorine atoms.

Typical examples of $R_1$, $R_2$ and $R_3$ are as follows:

| $R_1$ | $R_2$ | $R_3$ |
|---|---|---|
| H | H | |
| CH$_3$ | CH$_3$ | } —CF$_2$—CF$_2$H |
| H | H | |
| H | CH$_3$ | |
| H | C$_2$H$_5$ | |
| H | C$_3$H$_7$ | } —CF$_2$—CFH—CF$_3$ |
| CH$_3$ | CH$_3$ | |
| CH$_3$ | C$_2$H$_5$ | |
| H | H$_2$ | |
| CH$_2$ | CH$_3$ | } —CF$_2$—CF$_2$—CF$_2$—CF$_2$H |

Other resists may be used as needed which are commercially available under the following trade names:

AZ series: 111, 119A, 120, 340, 1350B, 1350J, 1370, 1375, 1450, 1450J, 1470, 1475, 2400, 2415, 2430 (all manufactured by Shipley)

Waycoat HPR-204, 205, 206, 207, 1182

Waycoat MPR (all above manufactured by HURT)

Kodak Micro Positive Resist (manufactured by Eastoman Kodak)

Isofine Positive Resist (manufactured by MICROIMAGE TECHNOLOGY)

PC 129, 129 SF (manufactured by POLYCHROME)

OFPR 77, 78, 800

OEBR 1000, 1010, 1030

ODUR 1000, 1001, 1010, 1013, 1014 (all above manufactured by TOKYO OHKA KOGYO)

EBR 1, 9 (manufactured by Toray Industry)

FMR E100, E101 (manufactured by FUJI YAKUHIN KOGYO)

JSR Positive Photoresist PFR3003 (manufactured by JAPAN SYNTHETIC RUBBER)

Selectilux P (manufactured by MERCK)

Now the present invention will be described in more detail with respect to embodiments thereof:

Embodiment 1

A glass substrate (glass #7059 manufactured by Corning Glass Works Co., Ltd.), both surfaces of which are already ground was washed normally with a neutral detergent or an organic alkali detergent. The glass substrate thus obtained was set in a capacitive-coupling glow discharge evaporation device and kept under a vacuum of $1 \times 10^{-6}$ Torr at a temperature of 230° C. Epitaxial grade pure $SiH_4$ manufactured by KOMATSU ELECTRONICS gas was then fed to the device at a flow rate of 10 SCCM to set the gas pressure to 0.07 Torr. A 13.56 MHz high frequency source was then used which performed a glow discharge with a 2.0 KV input voltage and with 2-minute 120 W discharge power, thereby forming an underlying a-Si:H layer having a thickness of the order of 400 Å on the substrate. Immediately thereafter, the input voltage was stepped down to 0.3 KV and glow discharge was performed with 8 W discharge power for 4.5 hours, thereby forming an overlying an a-Si:H layer of the order of 0.8 μ.

A gaseous mixture of $SiH_4$ diluted with $H_2$ to 10% and $PH_3$ diluted with $H_2$ to 100 ppm mixed at a mixing ratio of 1:10 was used as a material to deposit an n+ ohmic contact layer of the order of 0.15 μ on the overlying layer with 30 W discharge power. An electron beam evaporation method was then used which evaporated Al into a 0.3 μ - thick conductive layer.

Thereafter, a photoresist pattern having a desired shape was formed with a positive type or acting photoresist (Shipley "AZ-1370"). Exposed portions of the conductive layer were removed by a solution consisting of phosphoric acid (85 volume % aqueous solution), nitric acid (60 volume % aqueous solution), glacial acetic acid, and water, mixed at a volume ratio of 16:1:2:1 (referred to as "etching solution" hereinafter). Exposed n+ layers were then removed at 120 W RF discharge power and at 0.07 Torr gas pressure by $CF_4$ gas dry etching in plasma etching method using a parallel-plate device. Then the photoresist was peeled off.

Then a 0.7 μm-thick silicon nitride layer was formed by a glow discharge with 30 W discharge power and at 0.1 Torr gas pressure performed for 2 hours through a source gas consisting of $NH_3$ and $SiH_4$ diluted with $H_2$ to 10% mixed at a mixing ratio of 5 : 1.

This protective layer was then coated with a positive acting photoresist (trade name "ODUR 1013" manufactured by TOKYO OHKA KOGYO Co., Ltd.) to a film thickness of 10,000 Å using spinner coating method. The resulting intermediate product was prebaked for 20 minutes at 120° C., mask exposed to a far-ultraviolet radiation, dipped for 3 minutes in a developing solution used exclusively or specialized for ODUR 1010 series positive photoresists, thereby forming a resist mask. The entire surface of photosensor at which the resist mask was formed was then exposed so as to be dissolved in the solvent. The photosensor a Mo (molybdenum) boat filled with Cu phthalocyanine were set in a vacuum container. The Mo boat was then heated up to 450°–550° C. under a vacuum of $10^{-5}$–$10^{-6}$ Torr for evaporation of Cu phthalocyanine, thereby forming a 2000 Å film. The resulting intermediate product was then dipped in the developing solution used exclusively for the ODUR 1010 series and the developing solution was stirred to dissolve the resist mask while unnecessary portions of the evaporation film was being removed, thereby forming a patterned blue coloring matter layer.

In the same way, "IRGAZIN Red BPT" (trade name; C.I. No. 71127, manufactured by CIBA-GEIGY A.G.) for a red coloring matter layer, and Pb phtalocyanine for a green coloring layer were used. Thus, corresponding color filters and hence a color photosensor were formed.

On the other hand, for the purpose of comparison, the surface of the same glass substrate as that mentioned above was treated for 30 seconds with a solution of hydrogen fluoride (49 volume % aqueous solution), nitric acid (60 volume % aqueous solution) and acetic acid mixed at a volume ratio of 1 : 5 : 40. The substrate was then treated in the same steps as those mentioned above except that no underlying a-Si:H layer was formed, thereby forming a planar photosensor (referred to as "substrate acid treatment-present and underlying layer-absent photosensor hereinafter).

When, under the same conditions, while light was guided into each of the two different photosensors from the side of the color filter thereof and the values of the photocurrent outputs from the photosensors were compared, both the values were known to be substantially the same. It will be understood that this exhibits that the presence of underlying a-Si:H layer 2 does not deteriorate the S/N.

When, under the same conditions, heat cycle durability test of the different photosensors was performed, it was known that no film peeling-off occurred; i.e. adequate adhesion was ensured.

Embodiment 2

The same steps as those performed in the embodiment 1 were performed except that when underlying a-Si:H layer 2 was formed in the course of formation of the photosensor of the embodiment 1, glow discharge was performed at the combinations of discharge power and discharge times shown in the following Table I:

TABLE I

| Discharging power (W) | 80 | 50 | 30 | 8 | 4 |
|---|---|---|---|---|---|
| Discharge time (minutes) | 3 | 4 | 6 | 18 | 40 |

As a result, in the case of discharge power 80 W and 50 W, photosensors were produced with no peeled films. In the case of discharge power 30 W, 8 W and 4 W, however, film peeling-off occurred in the photolithography step using photoresist AZ-1370 (including washing by an ultrasonic washing machine) and no desired excellent photosensors were obtained.

Embodiment 3

Figure 3:
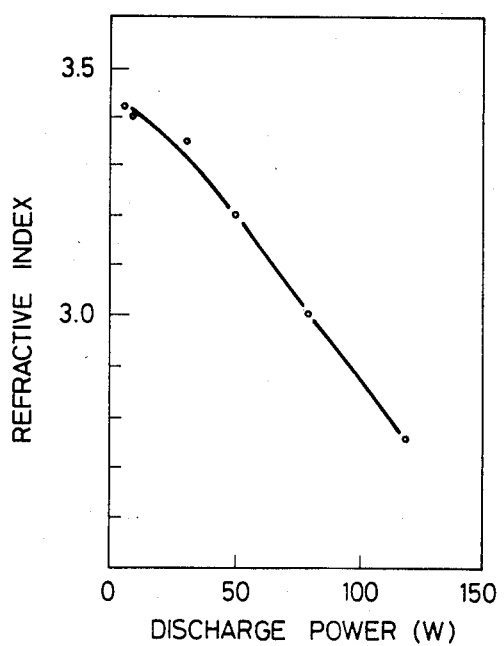
FIGS. 3 and 4 are graphs of the characteristics of an underlying a-Si:H layer.

In the same way as in the embodiments 1 and 2, underlying a-Si:H layer 2 was formed, substrate 1 was then taken out and the refractive index of underlying a-Si:H layer 2 formed on substrate 1 was measured. The relationship between the discharge power of glow discharge and the refractive index of underlying a-Si:H layer 2 is shown in FIG. 3.

Figure 4:
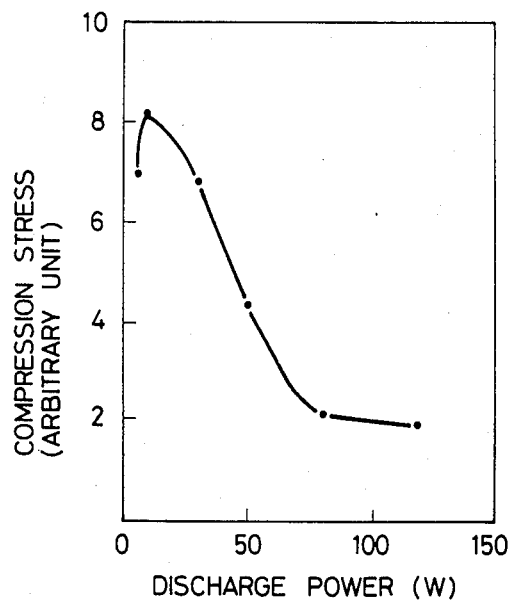

It is considered that adhesion between the substrate and the photoconductive layer is related to the discharge power of glow discharge and that film peeling-off is due to the total resultant stress of genuine stress induced depending on the inside structure of the film and inside stress depending on the difference in coefficient of thermal expansion between the substrate and the film. The total stress across the underlying a-Si:H layer 2 formed on substrate 1 was measured. The relationship between the discharge power of glow discharge and the total stress of underlying a-Si:H layer 2 is shown in FIG. 4. It will be understood that stress appears in the form of compression stress, exhibits a maximum in the vicinity of 10 W discharge power, and decreases as discharge power increases. It is considered that the reason why stress decreases as discharge power increases is that voids increasing in the film will create tensile stress which then cancel the compression stress.

As described above, the photoconductivity of the photoconductive layer is related to discharge power in the film formation, and evaporation is required to be performed at relative low discharge power in order to obtain a desired photoconductive characteristic. Therefore, a-Si:H layer 3 in each of the above embodiments 1 and 2 was deposited at relatively low discharge power.

It will be understood from the above that the underlying a-Si:H layer of the photosensor according to the present invention acts as a stress releasing layer and improves the adhesion between the substrate and the photoconductive layer. In the photosensor according to the present invention, the thickness of the underlying a-Si:H layer should preferably be not so thick; for example, preferably 3,000 Å or thinner.

Embodiment 4

The same steps as in the formation of the photosensor of the embodiment 1 were performed except that after formation of the overlying a-Si:H layer, glow discharge which was increased up to 80 W was performed for 25 minutes and that a further overlying a-Si:H layer was formed.

Figure 5:
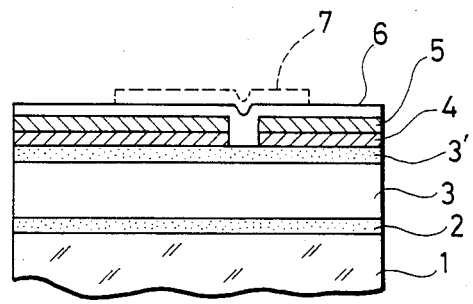
FIG. 5 is a partial cross-sectional view of the photosensor according to the present invention.

FIG. 5 is a partial sectional view of the resulting planar photosensor, showing a similar part to that of FIG. 2. In FIG. 5, the same reference numeral is used to denote similar elements to those of FIG. 2. Reference numeral 3' denotes an overlying a-Si:H layer, the thickness of which is 0.3 $\mu$. The speed of forming a unit thickness of this layer was remarkably higher than that of forming a unit thickness of overlying a-Si:H layer 3 because the discharge power was increased.

In the photosensor obtained in the present embodiment, underlying a-Si:H layer 2 and overlying a-Si:H layer 3 and 3' constitute the photoconductive layer. According to the photosensor of the present embodiment, the photocurrent obtained is larger than that of embodiment 1 because of an increased film thickness of the overlying a-Si:H layer.

Embodiment 5

The same steps as in the formation of the photosensor of the embodiment 1 were performed except that the substrate temperature was kept at 70° C. in the formation of underlying a-Si:H layer 2 and that glow discharge was performed at 8 W discharge power for 15 minutes.

When underlying a-Si:H layer 2 was formed under the same conditions, substrate 1 was taken out and the refractive index of underlying a-Si:H layer 2 was measured. The obtained refractive index was 3.10. The photosensor obtained in the present embodiment was as excellent as the photosensor obtained in the embodiment 1.

Embodiment 6

The same steps as in the formation of the photosensor of the embodiment 1 were performed except that SiH$_4$ diluted with H$_2$ to 5% was used as a source gas in the formation of underlying a-Si:H layer 2 and that glow discharge was performed at 30 W discharge power for 10 minutes.

When underlying a-Si:H layer 2 was formed under the same conditions, the substrate was taken out and the refractive index of underlying a-Si:H layer 2 was measured. The obtained refractive index was 3.02. The photosensor obtained in the present embodiment was as excellent as that obtained in the embodiment 1.

Embodiment 7

The same steps as in the formation of the photosensor of the embodiment 1 were performed except that the gas pressure was kept at 0.30 Torr and glow discharge was performed at 50 W discharge power for 5 minutes in the formation of a-Si:H layer 2.

When underlying a-Si:H layer 2 was formed under the same conditions, the substrate was taken out and the refractive index of underlying a-Si:H layer 2 was measured. The obtained refractive index was 3.12. The photosensor obtained in the present embodiment was as excellent as that obtained in the embodiment 1.

Embodiment 8

Figure 6:
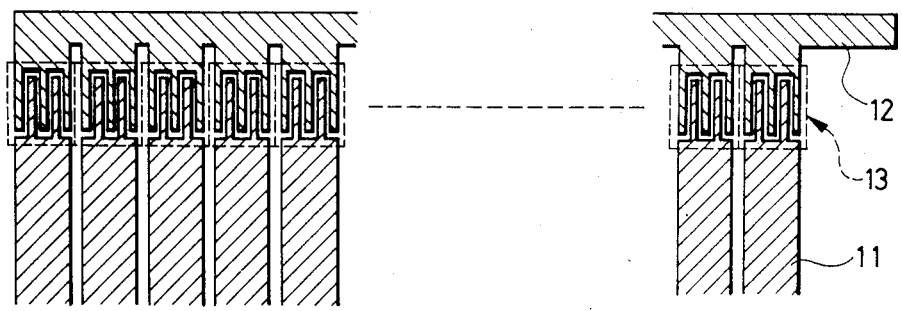
FIG. 6 is a partial plan view of a photosensor array.

An array of 864 photosensors was formed on the same substrate using the same method as that employed in the embodiment 1. In this case, the photosensors were arranged such that the color filters formed a repetitions arrangement of R, G and B is this order, as shown in FIG. 1. This can be performed easily by setting a mask appropriately in the lithography process. The outlines of the strip photosensor array thus obtained are shown in a plan view in FIG. 6. In FIG. 6, reference numeral 11 denotes each of individual electrodes. Reference numeral 2 denotes a common electrode. Reference numeral 13 denotes a color filter. This strip array of photosensors has a density of 8 bits/mm and a length equal to the width of an A6 size.

Uniformity in photocurrent and dark current between the bits of the photosensor array obtained in the present embodiment was measured. In this case, incident light were used which were such that the luminous energy after transmission through the respective filters R, G and B become equal. The results of the measurement are shown in FIG. 7.

On the other hand, for the purpose of comparison, uniformity in photocurrent and dark current between the bits of the strip array of 864 photosensors, formed on the same substrate, using the same substrate acid treatment-present and underlying layer-absent method as that described with respect to the embodiment 1, was measured in the same way. The results of this measurement are shown in FIG. 8.

Figure 7:
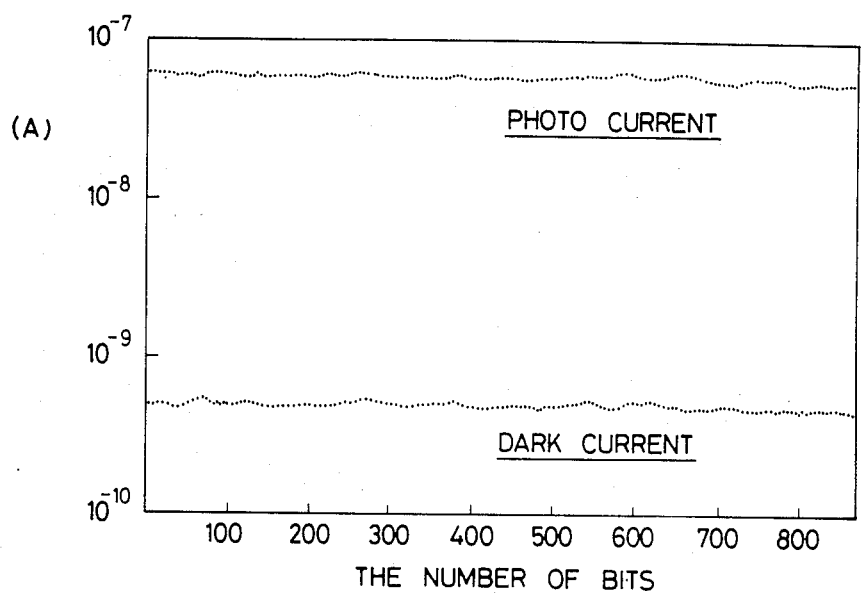
FIGS. 7 and 8 are graphs of the characteristics of a photocurrent and a dark current through the array.
Figure 8:
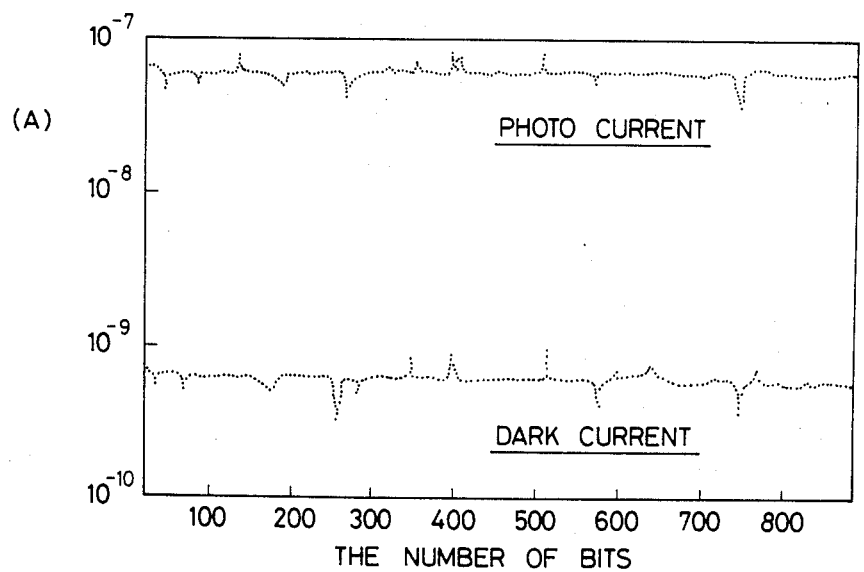

Comparison of FIGS. 7 and 8 exhibits that in the photosensor according to the present invention, no microscopic defects are present on the substrate and the underlying a-Si:H layer acts a stress releasing layer, thereby bringing about very excellent uniformity of the photoconductive characteristic.

Embodiment 9

A color photosensor was formed in the same way as that of the embodiment of FIG. 1 except that a red color filter including a red coloring matter layer having a film thickness of the order of 2,000 Å was formed by heating "NOVOPERM Red BL" (HOECHST PHARMACEUTICALS) up to 400°–500° C.

The color filter of the photosensor thus obtained and the conventional dyeing color filter were compared in performance:

(1) Heat resistance:

A heat resistance test was performed at 250° C. for one hour. As a result, a change in the spectral characteristic of the conventional dyeing filter was large (the peak transmission factor was more than 10%; the peak wavelength shift was more than 10 nm). In contrast, a change in the spectral characteristic of the evaporation filter of the present embodiment was small (the peak transmission factor was less than 5%; the peak wavelength shift was less than 5 nm).

(2) Light resistance

A light resistance test was performed by 500-hour irradiation of Xe lamp luminous energy. As a result, a change in the spectral characteristic of the conventional dyeing filter was large (the peak transmission factor was more than 10%; the peak wavelength shift was 10 nm or more). In contrast, little change in the spectral characteristic of the evaporation filter of the present embodiment was seen.

Embodiment 10

Figure 9:
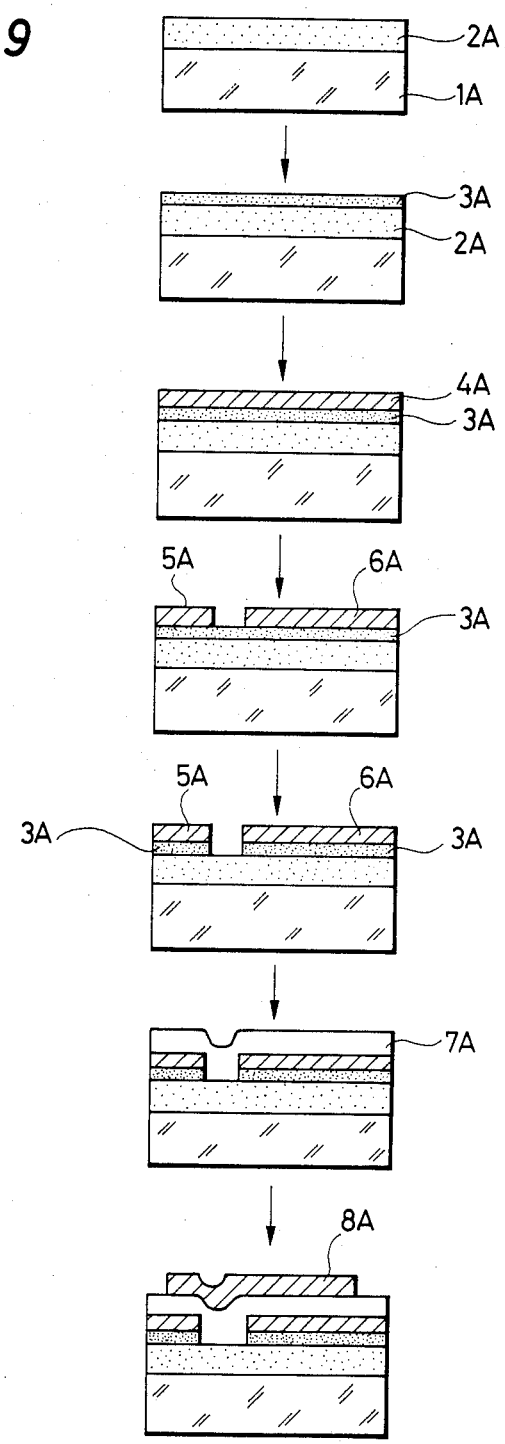
FIG. 9 illustrates the steps of forming the color photosensor according to the present invention in respective cross-sectional views of intermediate products of the photosensor.
Figure 10:
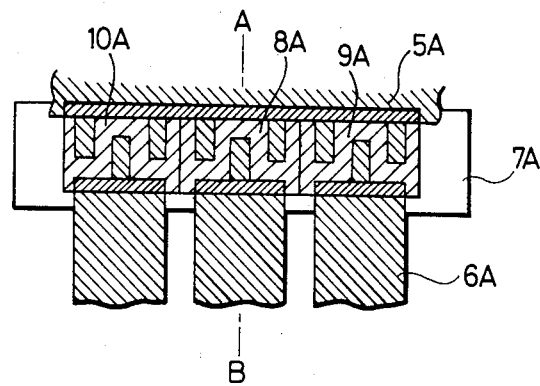
FIG. 10 is a plan view of a color photosensor according to the present invention.

FIG. 9 is cross-sectional views of intermediate products for illustrating the formation of a preferred embodiment of a color photosensor according to the present invention. FIG. 10 is a partial schematic plan view of a color photosensor obtained by execution of the present invention.

First, an a-Si:H photoconductive layer (intrinsic layer) 2A was formed on a glass substrate (Corning Glass #7059) 1A using glow discharge; i.e. 0.7 $\mu$-thick photoconductive layer 2A was obtained by deposit of $SiH_4$ diluted with $H_2$ to 10 volume %, under 0.50 Torr was pressure, with 10 W RF (Radio Frequency) power, at a 250° C. substrate temperature for 2 hours. Similarly, an n+ layer 3A was formed using glow discharge; i.e. a gas comprising $SiH_4$ diluted by $H_2$ to 10 volume % and $PH_3$ diluted by $H_2$ to 100 ppm, mixed at a mixing rate of 1 : 10 was used as a material, and other conditions and steps performed were similar to those of the photoconductive layer 2A deposit. Thus, 0.1 $\mu$-thick n+ layer 3A continuous to photoconductive layer 2A was formed. Alminum was then evaporated to a 0.3 $\mu$ thickness to form a conductive layer 4A. Subsequently parts of conductive layer 4A corresponding to future photoelectric conversion cells were removed. That is, a photoresist pattern having a desired shape (the zigzag interelectrode distance was 4 $\mu$) was formed with a positive acting photoresist (Shipley "MICROPOSIT 1300-27" trade name)). Parts of exposed photoconductive layer 4A were removed using an etching solution consisting of phosphoric acid (85 volume % aqueous solution), nitric acid (60 volume % aqueous solution), glacial acetic acid, and water mixed at a volume ratio of 16 : 1 : 2 : 1, thereby forming common electrode 5A and individual electrodes 6A. Parts of n+ LAYER 3A were removed to form the photoelectric conversion cells. More particularly, after removal of the MICROPOSIT 1300-27 photoresist, dry etching was performed with $CF_4$ gas for 5 minutes at 120 W RF power and at 0.1 Torr $CF_4$ gas pressure by plasma etching method (or reactive ion etching method) using the parallel-plate plasma etching device ("DEM-451" manufactured by ANELVA CORP.) to remove parts of exposed n+ layer 3A and photoconductive layer 2A surface. In order to prevent implantation of the material forming the cathode of the etching device, a polysilicon sputtering target (8 inches in diameter, 99.999% in purity) was placed on the cathode, a specimen was put on the target, an exposed SUS portion of the cathode material was covered with a doughnutlike Teflon (trademark) or polytetrafluorethyline sheet so that there was little SUS surface exposed to plasma, and then etching was performed. Heat treatment was then performed at 200° C. for 60 minutes within an oven through which nitrogen was passed at 3 l/min.

A protective layer was formed in the following steps on the surface of the photosensor array thus prepared before formation of the coloring matter layer.

A silicon nitride (a-Si:N:N) layer 7A was formed on the photosensor array using glow discharge method. More particularly, a 0.5 $\mu$-thick silicon nitride (a-Si:N:N) layer 7A was formed in the same conditions as those in the formation of the overlying a-Si:H layer except that a gas was used which included $SiH_4$ diluted with $H_2$ to 10 volume % and 100% $NH_3$, mixed at a flow rate ratio of 1 : 4.

A positive acting resist (TOKYO OHKA KOGYO "ODUR 1013" (trade name)) was coated on this protective layer to a film thickness of 5,000–7,000 Å using Spinner coating method. The resulting intermediate product was prebaked at 120° C. for 20 minutes, mask exposed to a far-ultraviolet radiation, dipped for 3 minutes in the developing solution specialized for the ODUR 1010 series, and dipped for 2 minutes in the rinse specialized for the ODUR 1010 series, thereby forming a resist mask. The entire surface of the photosensor array at which the resist mask was formed was exposed to be dissolved in a solvent. The photosensor array and an Mo boat filled with Cu phthalocyanine were placed within a vacuum container and the Mo boat was heated up to 450°–550° C. under a $10^{-5}$–$10^{-6}$ Torr vacuum to evaporate Cu phthalocyanine into a 2,000 Å-thick film. The resulting intermediate product was dipped in the developing solution specialized for the ODUR 1010 series and the developing solution was stirred to dissolve the resist mask while unnecessary portions of the evaporated film was being removed, thereby forming a patterned blue coloring matter layer 8A.

ODUR 1013 was then coated on this patterned blue coloring matter layer overlying the photosensor, exposed and developed to form a resist mask corresponding to the next patterned green coloring matter. After the entire surface of the resist mask was exposed, the mask was placed within a vacuum evaporator where Pb phthalocyanine was in turn evaporated at 450°–550° C. to form a 2,000 Å film. Subsequently, "FASTOGEN SUPER Yellow GROH" (trade name of DAINIPPON INK & CHEMICALS) as isoindolenone coloring matter was evaporated into a film having a thickness of the order of 4,000 Å. The resulting intermediate product was dipped in the developing solution which was then stirred, thereby forming a patterned green coloring matter layer 9A. In addition, in quite similar steps, "IRGAZIN Red BPT (trade name of CIBA-GEIGY, C.I. No. 71127) as perylenetetracarboxylic acid derivative red coloring matter was evaporated to form a layer having a thickness of the order of 2,000 Å at 400°–500° C. and the layer was then treated with the developing solution, thereby obtaining a patterned red color matter layer 10A. At this time, the blue and green coloring matter layers as well as the IRGZIN Red BPT layer were neither dissolved by the developing solution treatment nor damaged in spectral characteristic.

Figure 11:
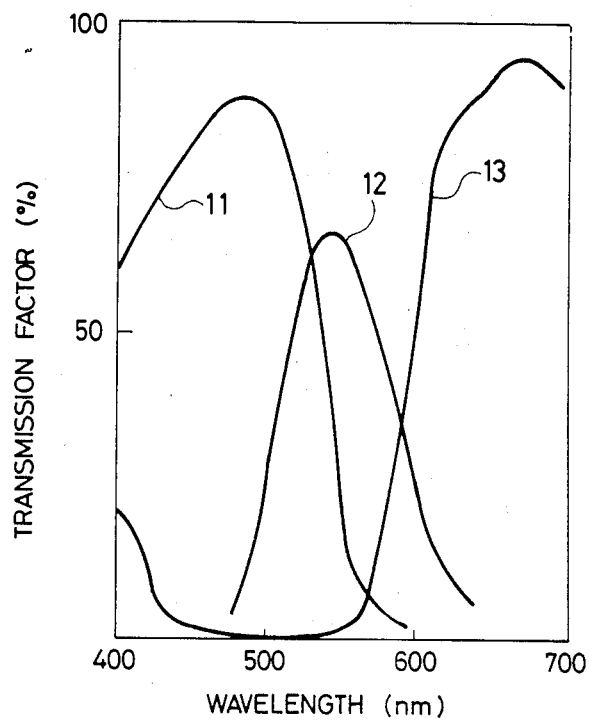
FIGS. 11–16 are graphs of the spectral characteristics of the color filter.

In the above serial steps, no coloring matter and photosensor array used were damanged by solvents, heat, etc., thereby forming a color photosensor array with a color filter having an excellent spectral characteristic. The spectral characteristic of the color filter thus obtained is shown by reference numerals 11, 12 and 13 in FIG. 11.

For comparison with the conventional art, BAYER "ASTRAPHLOXIN G" was tried in similar steps to the above. As a result, an evaporation film was formed, but it was violated by the solvent in the developing step, thereby resulting in no desired patterned red coloring matter layer.

The a-Si:H layer photosensor array thus obtained served to effect excellent reading and outputting of blue, green and red colors at 8 dots/mm.

Embodiment 11

In the same way as in the embodiment 10, a photosensor array and then a protective layer were formed. A positive acting resist ("ODUR 1013"; trade name of TOKYO OHKA KOGYO) was coated on the protective layer by Spinner coating to a film thickness of the order of 5,000–7,000 Å.

The resulting intermediate product was prebaked at 120° C. for 20 minutes, mask exposed to a far-ultraviolet radiation, dipped for 3 minutes in the developing solution specialized for the ODUR 1010 series, and dipped for 2 minutes in the rinse solution specialized for the ODUR 1010 series to form a resist mask. The entire surface of the photosensor at which the resist mask was formed was exposed to be dissolved in the solvent. The glass substrate with the resist mask thereon and a Mo evaporation boat filled with Cu phthalocyanine were placed within a vacuum evaporator which was then evacuated. The evaporation boat was heated up to 450°–550° C. under a $10^{-5}$–$10^{-6}$ Torr vacuum to evaporate Cu phthalocyanine into a film having a thickness of the order of 2,000 Å. Then Toyo Ink "LIONOGEN Magenta R" as quinacridone coloring matter was evaporated into a film having a thickness of the order of 2,000 Å. The resulting glass substrate was dipped in the specialized developing solution which was then stirred to dissolve the resist mask as well as to remove unnecessary portions of the evaporation film, thereby forming a patterned blue coloring matter layer 8A. In similar steps to those mentioned above, ODUR 1013 was then coated on the photosensor array, exposed and developed, thereby forming a resist mask corresponding to the next patterned green coloring matter. The entire surface of the resist mask was exposed, and then the resulting intermediate product was placed in the vacuum evaporator where Pb phthalocyanine was evaporated at 450°–550° C. onto the resist mask to a film thickness of 2,000 Å. Subsequently "FASTOGEN SUPER Yellow GROH (trade name of DAINIPPON INK & CHEMICALS) as isoindolenone coloring matter was evaporated into a film having a thickness of the order of 4,000 Å. The resulting intermediate product was dipped in the developing solution which was then stirred, thereby forming a patterned green coloring matter layer 9A. In addition, in quite similar steps to the above, "IRGAZIN Red BPT (trade name of CIBA-GEIGY, C.I. No. 71127) as perylenetetracarboxylic acid derivative red coloring matter was evaporated at 400°–500° C. into a film having a thickness of the order of 2,000 Å, and the film was then treated with the developing solution to form a patterned red coloring matter layer 10A. At this time, it was found that the blue and green coloring matter layers as well as the IRGAZIN Red BPT film were neither dissolved in the developing solution nor damaged in spectral characteristic.

Figure 12:
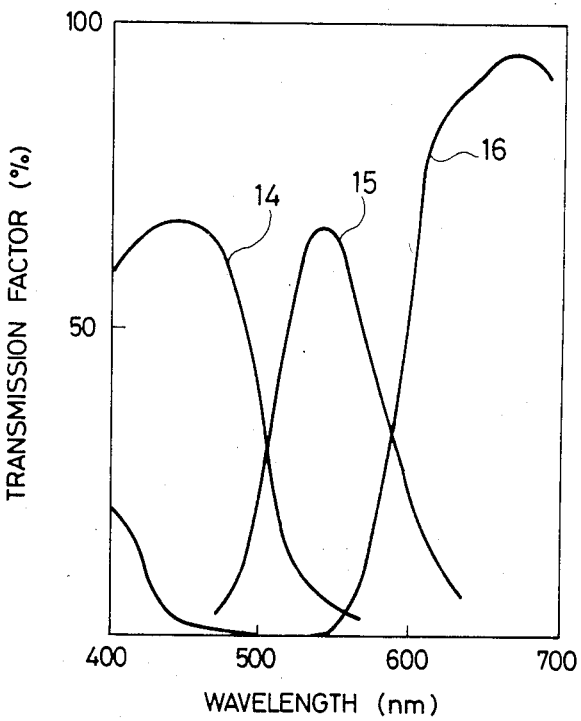

In the above serial steps, no coloring matter and photosensor array used were damaged by solvents, heat, etc., thereby forming a color photosensor array with a color filter having an excellent spectral characteristic. The spectral characteristic of the color filter thus obtained is shown by reference numerals 14, 15, 16 in FIG. 12.

The color photosensor array thus obtained served to read a 3-colored document clearly.

Embodiment 12

In the same manner as in the embodiment 10, a photosensor array and a protective layer were formed. A positive type or acting photoresist ("ODUR 1013" trade name of TOKYO OHKA KOGYO) was coated on the protective layer to a film having a thickness of the order of 5,000–7,000 Å using Spinner coating method.

The resulting intermediate product was then prebaked for 20 minutes at 120° C., mask exposed to a far-ultraviolet radiation, dipped for 3 minutes in the developing solution used exclusively or specialized for the ODUR 1010 series dipped for 2 minutes in the rinse liquid used exclusively or specialized for the ODUR 1010 series to form a resist mask. The entire surface of the photosensor array at which the resist mask was formed was exposed to be dissolved in a solvent.

The glass substrate on which the resist mask was formed and a Mo evaporation boat filled with Cu phthalocyanine were then placed within the vacuum evaporator which was then evacuated. The evaporation boat was heated up to 450°–550° C. under a $10^{-5}$–$10^{-6}$ Torr vacuum to evaporate CU phthalocyanine into a film having a thickness of the order of 2,000Å. The resulting glass substrate was dipped in the specialized developing solution which was then stirred to dissolve the resist mask as well as unnecessary portions of the evaporated film, thereby forming a patterned blue coloring matter layer 8A.

In the same steps as in the above, ODUR 1013 was then coated on the photosensor array with the patterned blue coloring matter film thereon, exposed and developed to form a resist mask corresponding to the next patterned green coloring matter.

After the entire surface of the resulting sensor array was exposed, the array was set within a vacuum evaporator where Pb phthalocyanine was now evaporated at 450°–550° C. into a film having a thickness of 2,000 Å. Then the array thus obtained was dipped in the developing solution which was then stirred, thereby forming a patterned green coloring matter layer 9A. In quite the same steps, CIBA-GEIGY "IRGAZIN Red BPT" (trade name, C.I. No. 71127) as perylenetetracarboxylic acid derivative red coloring matter was evaporated at 400°–500° C. into a film of the order of 2,000 Å, which was then treated in the developing solution, and thus a patterned red coloring matter layer 10A was provided. At this time, the Cu phthalocyanine, Pb phthalocyanine and "IRGAZIN Red BPT" films were never dissolved in the developing solution treatment and no spectral characteristic of the photosensor array was damaged.

Figure 13:
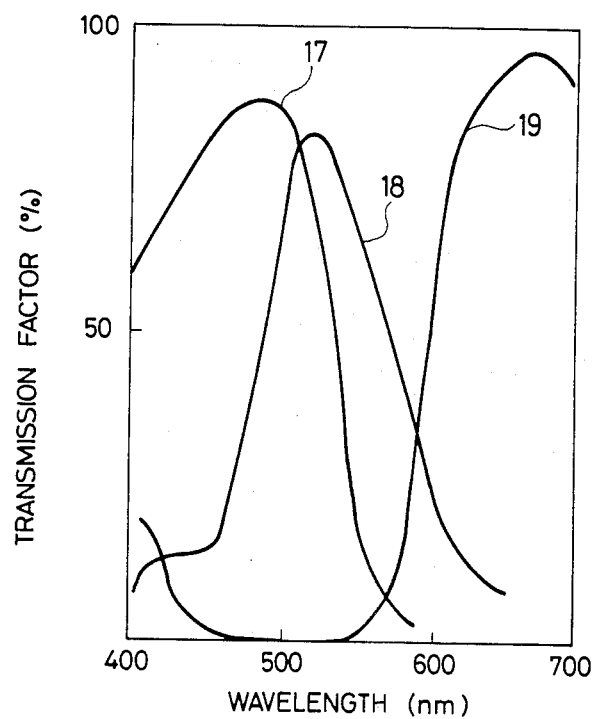

In the above serial steps, no coloring matter and photosensor array used were damaged by solvents, heat, etc., and thereby a color photosensor array with a color filter having an excellent spectral characteristic was obtained. The spectral characteristic of the color filter thus obtained is shown by reference numerals 17, 18, 19 in FIG. 13. The color photosensor array thus obtained served to effect excellent color reading.

Embodiment 13

In the same way as in the embodiment 10, a photosensor array and then a protective layer were formed. A positive acting resist (TOKYO OHKA KOGYO "ODUR 1013" (trade name) was coated by Spinner coating method on the protective layer to a film having a thickness of the order of 5,000–7,000 Å.

The intermediate product was prebaked at 120° C. for 20 minutes, mask exposed to a farultraviolet radiation, dipped for 3 minutes in the developing solution used exclusively or specialized for the ODUR 1010 series, and dipped for 2 minutes in the ringe solution used exclusively or specialized for the ODUR 1010 series to form a resist mask. The entire surface of the photosensor at which the resist mask was formed was exposed thereby to be dissolved in the solvent.

The photosensor array with the resist mask thereon and a Mo evaporation boat filled with Cu phthalocyanine were then placed within a vacuum evaporator which was then evacuated. The evaporation boat was heated up to 450°–550° C. under a $10^{-5}$–$10^{-6}$ Torr vacuum to evaporate Cu phthalocyanine into a film having a thickness of the order of 2,000 Å. The resulting photosensor array was dipped in the specialized developing solution, which was then stirred to dissolve the resist mask as well as to remove unnecessary portions of the evaporation film, and thereby a patterned blue coloring matter layer 8A was formed.

In similar steps, ODUR 1013 was then coated on the layer 8A, exposed and developed, and thereby a resist mask corresponding to the next patterned green coloring matter was formed. After the entire surface of the photosensor array thus obtained was exposed, the photosensor array with the resist pattern and a Mo evaporation boat filled with Cu phthalocyanine were placed within the vaccum evaporator, which was then evacuated. The evaporation boat was heated up to 450°–550° C. at a $10^{-5}$–$10^{-6}$ Torr vacuum to evaporate Cu phthalocyanine into a film having a thickness of the order of 1,300 Å.

In a similar method, CIBA-GEIGY "CROMOPHTAL Yellow AGR" (trade name) as an anthraquinone coloring matter was evaporated into a film having a thickness of the order of 4,000 Å. The glass substrate on which evaporation was performed was dipped in the speciallized developing solution which was then stirred to dissolve the resist pattern as well as to remove unnecessary portions of the evaporation film at the same time, and thereby a green coloring layer 9A was formed. In addition, in quite similar steps, CIBA-GEIGY "IRGAZIN Red BPT" (trade name, C.I. No. 71127) as perylenetetracarboxylic acid derivative red coloring matter was evaporated at 400°–500° C. to form a film having a thickness of the order of 2,000 Å, and the film was treated with the developing solution to form a patterned red coloring matter layer 10A.

At this time, it was found that the blue and green coloring matter and IGRAZIN Red BPT layers were neither of dissolved in the developing solution nor damaged in spectral characteristic.

Figure 14:
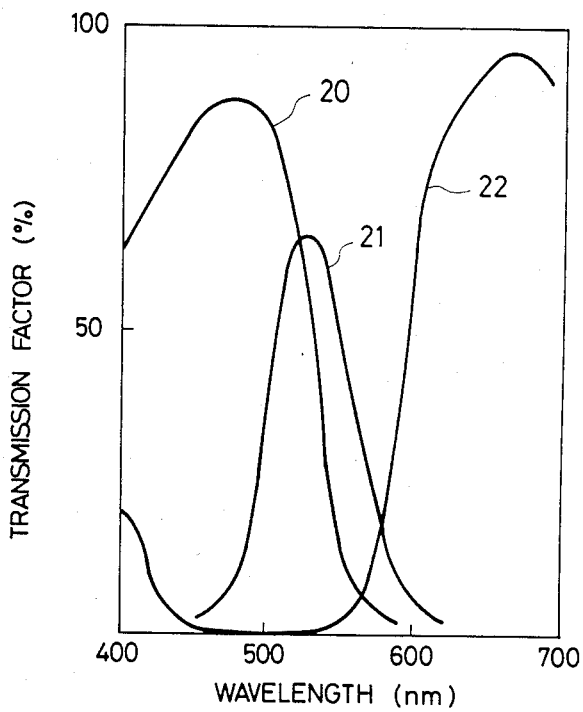

In the above serial steps, no coloring matter and photosensor array used were damaged by solvents, heat, etc., and thereby a color photosensor array with a color filter having an excellent spectral characteristic was formed. The spectral characteristic of the color filter thus obtained is shown by reference numerals 20, 21, 22 in FIG. 14.

The color photosensor array thus obtained served to effect color reading similar to that by the above embodiments.

Embodiment 14

In the same way as in the embodiment 10, a photosensor array and then a protective layer were formed. A positive acting resist (TOKYO OHKA KOGYO "ODUR 1013" (trade name)) was coated by Spinner coating method on the protective layer to a film having a thickness of the order of 5,000–7,000 Å.

The resulting intermediate product was prebaked at 120° C. for 20 minutes, mask exposed to a far-ultraviolet radiation, dipped for 3 minutes in the developing solution used exclusively or specialized for the ODUR 1010 series, and dipped for 2 minutes in the rinse solution used exclusively or specialized for the ODUR 1010 series to form a resist mask. The whole surface of the photosensor array at which the resist mask was formed was exposed thereby to be dissolved in the solvent.

The photosensor array with the resist mask thereon and a Mo evaporation boat filled with Cu phthalocyanine were placed within a vacuum evaporator, which was then evacuated. The evaporation boat was heated up to 450°–550° C. under a $10^{-5}$–$10^{-6}$ Torr vacuum to evaporate Cu phthalocyanine into a film having a thickness of the order of 2,000 Å.

In a similar manner, TOYO INK "LIONOGEN Magenta" (trade name) as quinacridon coloring matter was evaporated into a film having a thickness of the order of 4,000 Å. The glass substrate on to which evaporation was performed was dipped in the specialized developing solution which was then stirred to dissolve the resist pattern as well as to remove unnecessary portions of the evaporation film and thereby blue coloring matter layer 8A was formed.

In similar steps, "ODUR 1013" was then coated on the layer 8A, exposed and developed, and thereby a resist mask corresponding to the next patterned green coloring matter was formed. After the entire surface of the photosensor array thus obtained was exposed, the photosensor array with the resist pattern thereon and a Mo evaporation boat filled with Cu phthalocyanine were placed within the vacuum evaporator, which was then evacuated. The evaporation boat was heated up to 450°–550° C. at a $10^{-5}$–$10^{-6}$ Torr vacuum to evaporate Cu phthalocyanine into a film having a thickness of the order of 1,300 Å.

In a similar method, CIBA-GEIGY "CROMOPHTAL Yellow AGR" (trade name) as anthraquinone coloring matter was evaporated into a film having a thickness of the order of 4,000 Å. The glass substrate on to which evaporation was performed was dipped in the specialized developing solution which was then stirred to dissolve the resist pattern as well as to remove unnecessary portions of the evaporation film at the same time, and thereby a green coloring layer 9A was formed. In addition, in quite similar steps, CIBA-GEIGY "IRG-ZIN Red BPT" (trade name, C.I. No. 71127) as perylenetetracarboxylic acid derivative red coloring matter was evaporated at 400°-500° C. into a film having a thickness of the order of 2,000 Å, and the film was treated with the developing solution to form a patterned red coloring matter layer 10A.

At this time, it was found that the blue and green coloring matter and "IGRAZIN Red BPT" layers were neither dissolved in the developing solution nor damaged in spectral characteristic.

Figure 15:
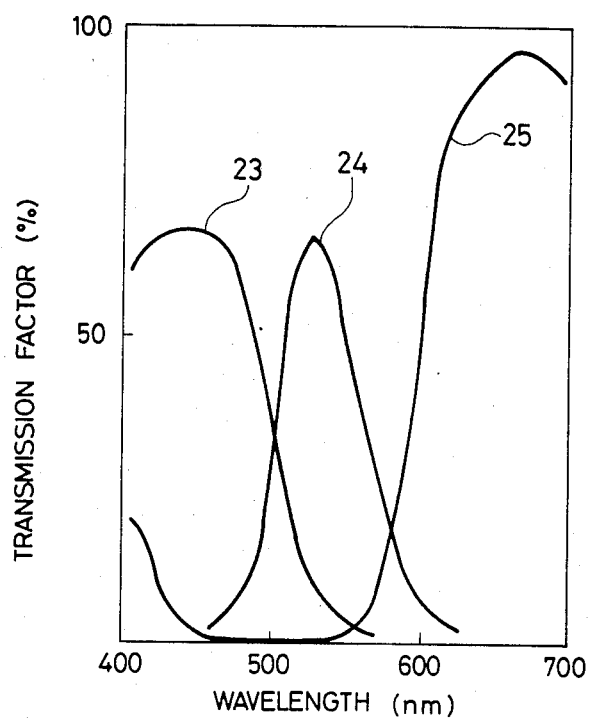

In the above serial steps, no coloring matter and photosensor array used were damaged by solvent, heat, etc., and thereby a color photosensor array with a color filter having an excellent spectral characteristic was formed. The spectral characteristic of the color filter thus obtained is shown by reference numerals 23, 24, 25 in FIG. 15. The present photosensor array served to effect excellent color reading.

Embodiment 15

In the same way as in the embodiment 10, a photosensor array and then a protective layer were formed. A positive acting resist (TOKYO OHKA KOGYO "ODUR 1013" (trade name) was coated by Spinner coating method on the protective layer to a film thickness of the order of 5,000–7,000 Å.

The resulting intermediate product was prebaked at 120° C. for 20 minutes, mask exposed to a far-ultraviolet radiation, dipped for 3 minutes in the developing solution specialized used for the ODUR 1010 series, and dipped for 2 minutes in the rinse solution specialized for the ODUR 1010 series to form a resist mask. The entire surface of the photosensor array at which the resist mask was formed was exposed thereby to be dissolved in the solvent.

The photosensor array with the resist mask thereon and a Mo evaporation post filled with Cu phthalocyanine were placed within a vacuum evaporator, which was then evacuated. The evaporation boat was heated up to 450°-550° C. under a $10^{-5}$-$10^{-6}$ Torr vacuum to evaporate Cu phthalocyanine into a film having a thickness of the order of 2,000 Å.

In a similar manner, TOYO INK "LIONOGEN Magenta" (trade name) as quinacridon coloring matter was evaporated into a film having a thickness of the order of 4,000 Å. The glass substrate on to which evaporation was performed was dipped in the specialized developing solution which was stirred to dissolve the resist pattern as well as to remove unnecessary portions of the evaporation film and thereby a blue coloring matter layer 8A was formed.

In similar steps, "ODUR 1013" was then coated on the layer 8A, exposed and developed, and thereby a resist mask corresponding to the next patterned green coloring matter was formed.

After the entire surface of the photosensor array with the resist mask thereon was exposed, the photosensor array was set within the vacuum evaporator and Pb phthalocyanine was now evaporated at 450°-550° C. into a film having a thickness of the order of 2,000 Å. The resulting intermediate product was dipped in the developing solution which was stirred, and thereby a patterned green coloring matter layer 9A was formed. In quite similar steps, CIBA-GEIGY "IRGAZIN Red BPT" (trade name, C.I. No. 71127) as perylenetetraxcarboxylic acid derivative red coloring matter was evaporated at 400°-500° C. into a film having a thickness of the order of 2,000 Å. The film was then treated by the developing solution and thereby a patterned red coloring matter layer 10A was formed. At this time, the Cu phthalocyanine, Pb phthalocyanine and "IRGAZIN Red BPT" films were never dissolved in the developing solution treatment and nor damaged in spectral characteristic.

Figure 16:
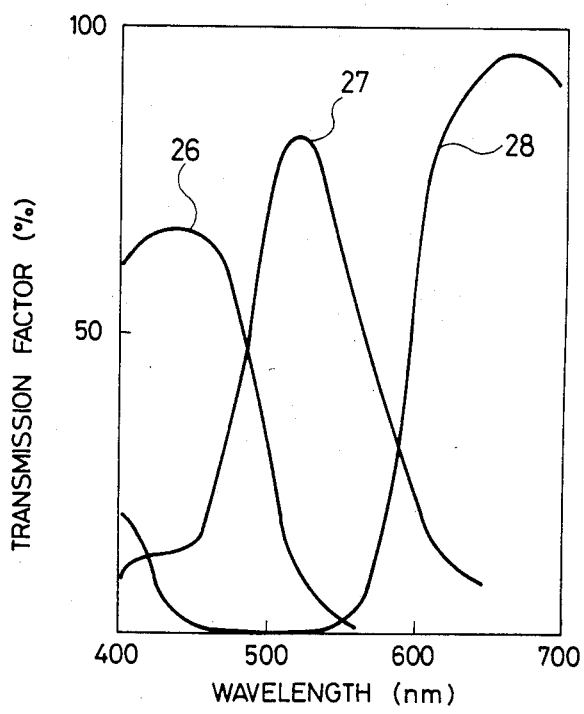
Figure 19:
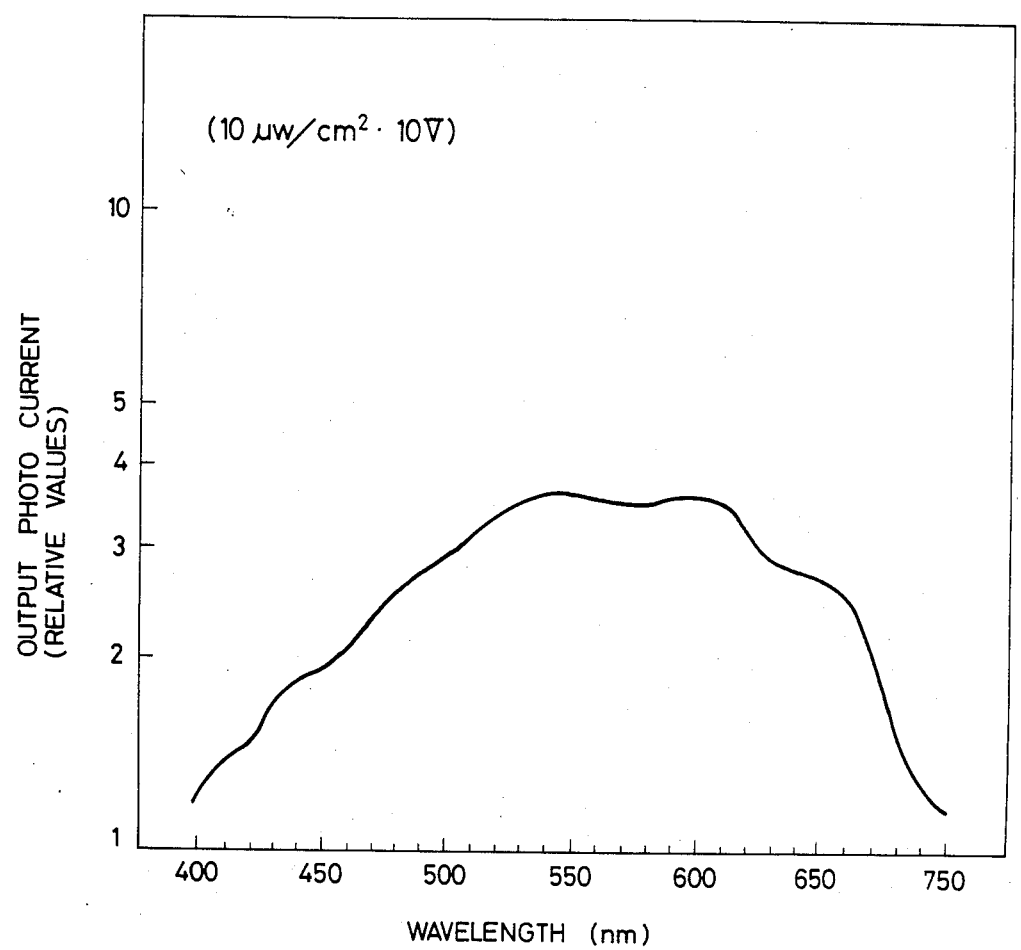
FIG. 19 is a graph of the spectral sensitivity characteristic of the a-Si:H photosensor.

In the above serial steps, no coloring matter and photosensor array used were damaged by solvent, heat, etc., and thereby a color photosensor array with a color filter having an excellent spectral characteristic was formed. The spectral characteristic of the color filter thus obtained is shown by reference numerals 26, 27, 28 in FIG. 16.

The present photosensor array served to effect good color reading.

Embodiment 16

Figure 17:
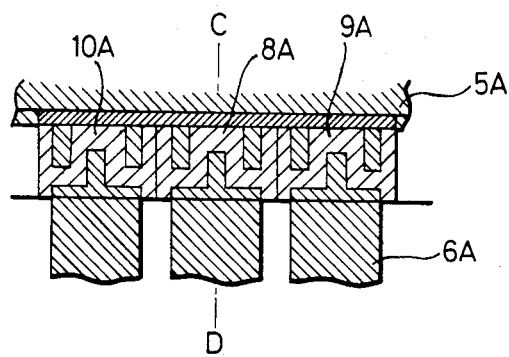
FIG. 17 is a plan view of a color photosensor according to the present invention.
Figure 18:
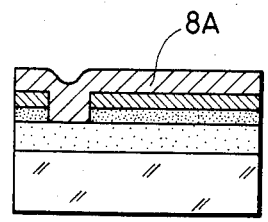
FIG. 18 is a cross-sectional view of the photosensor of FIG. 17.

In the embodiment 10, after formation of the photosensor array and before formation of the protective layer, a coloring matter layer was directly formed closely on the entire surface of the photosensor array. FIG. 17 is a partial schematic plan view of the coloring matter layer. FIG. 18 is a schematic cross-sectional view taken along a line C-D of FIG. 17.

The photosensor array thus formed served to effect excellent color reading. Although the a-Si:H photosensor had no a-Si:H film for passivation, the photosensor array was found to have excellent temperature and humidity characteristics and excellent durability.

According to the color photosensor according to the present invention, the color filter has excellent thermal and light resistance. The color filter can be formed in a thin film and also at a precise position even on a slightly rugged surface in the same process as that taken in the formation of other structural portions of the photosensor. Since the color filter needs no intermediate protective layer, little light is scattered and little reflection of light occurs. Thus an excellent photosensor performance results.

In the color photosensor according to the present invention, the color filter also serves as a protective layer, so that the absence of the protective layer decreases scattering and reflection of light correspondingly and the simplified layer structure realizes reduction of the number of process steps to be performed and hence cost.

A color filter in the preferred embodiment is formed by evaporation of coloring matter and the pattern is formed in a conventional photolithography method, so that in the formation of the color filter, the characteristic of the a-Si photoconductive layer is not substantially deteriorated. Since the pattern is formed in photolithography, the filter can be formed precisely on a rugged surface, thereby forming a highly accurate color filter In the preferred embodiment, the color filter includes a coloring material layer formed by evaporation, so that it has excellent light and thermal resistance to incident light, thereby maintaining excellent performance for a long time.

According to the present invention, uniformity in characteristic between the sensor units is improved.

What is claimed is:

1. A color photosensor, comprising a plurality of closely arranged sensor units, wherein at least one sensor unit is provided for each signal into which a color signal is decomposed, each sensor unit including a photoconductive layer which contains amorphous silicon formed on a substrate, a pair of electrodes in electrical contact with said photoconductive layer, a photoelectric conversion cell and a color filter provided at a position corresponding to that of said photoelectric conversion cell, wherein the color filter comprises at least one coloring matter layer selected from the following groups (A), (B) and (C):

(A) a red coloring matter layer including, as a main component, perylenetetracarboxylic acid derivatives selected from the following structural formulae (I) and II):

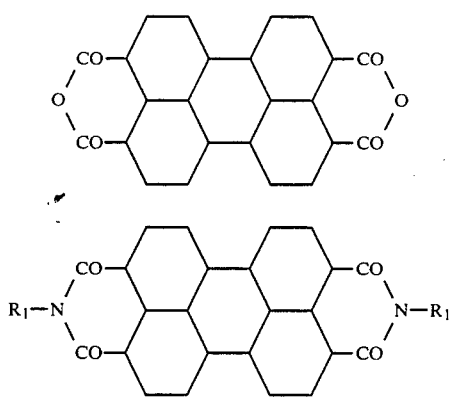

wherein $R_1$ denotes hydrogen, an alkyl group or an allyl group;

(B) a green coloring matter including, as a main component, phthalocyanine coloring matter, a combination of phthalocyanine coloring matter and isoindolenone coloring matter, or a combination of phthalocyanine coloring matter and anthraquinone coloring matter; and (C) a blue coloring matter including, as a main component, phthalocyanine coloring matter, or a combination of phthalocyanine coloring matter and quinacridon coloring matter.

2. A color photosensor according to claim 1, wherein said color filter includes a patterned coloring matter layer formed by removing a resist mask provided on said photosensor after said coloring matter is evaporated onto said resist mask.

3. A color photosensor, comprising a plurality of closely arranged sensor units, wherein at least one sensor unit is provided for each signal into which a color signal is decomposed, each sensor unit including a photoconductive layer which contains amorphous silicon formed on a substrate, a pair of electrodes in electrical contact with the photoconductive layer, a photoelectric conversion cell and a color filter of a coloring matter formed by evaporation at a position corresponding to that of said photoelectric conversion cell, the photoconductive layer of each sensor unit including a multilayered film of two ormore layers which have different refractive indices, wherein the undermost layer of the multilayered film has a refractive index of 3.2 or less for input light having a wavelength of 6,328 Å.

4. A color photosensor according to claim 3, wherein the coloring matter layer includes pigment as a main component.

5. A color photosensor according to claim 3, wherein said undermost layer of the photoconductive layer has a thickness of 3,000 Å or thinner.

6. A color photosensor according to claim 3, wherein said color filter comprises at least one color matter layer selected from the following groups (A), (B) and (C);

(A) a red coloring matter layer including, as a main component, perylenetetracarboxylic acid derivatives selected from the following structural formulae (I) and (II):

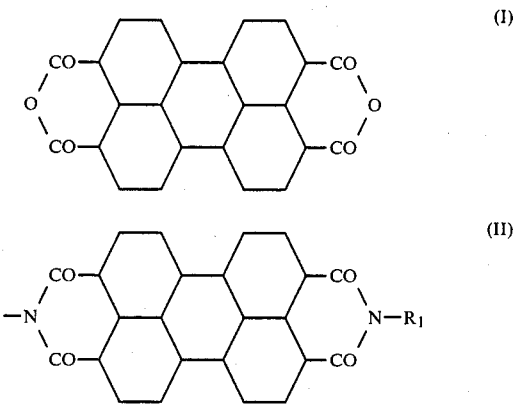

wherein $R_1$ denotes hydrogen, an alkyl group or an allyl group;

(B) a green coloring matter including, as a main component, phthalocyanine coloring matter, a combination of Phthalocyanine coloring matter and isoindolenone coloring matter, or a combination of phthalocyanine coloring matter and anthraquinone coloring matter; and (C) a blue coloring matter including, as a main component, phthalocyanine coloring matter, or a combination of phthalocyanine coloring matter and quinacridon coloring matter.

* * * * *

UNITED STATES PATENT AND TRADEMARK OFFICE
CERTIFICATE OF CORRECTION

PATENT NO. : 4,700,080

DATED : October 13, 1987

INVENTOR(S) : MASAKI FUKAYA, ET AL.

Page 1 of 6

It is certified that error appears in the above-identified patent and that said Letters Patent is hereby corrected as shown below:

AT [63] IN RELATED U.S. APPLICATION DATA

"Continuation-in-part" should read --Continuation--.

AT [57] IN THE ABSTRACT

"authraquinone" should read --anthraquinone--.

COLUMN 1

Line 21, "used" should read --being used--.
Line 47, "is" should read --is,--.
Line 65, "and" should read --to--.

COLUMN 2

Line 5, "the" should read --a--.
Line 38, "the" should be deleted.
Line 41, "the" should be deleted.

COLUMN 3

Line 23, "otherwide" should be deleted.

COLUMN 4

Line 44, "indexs" should read --index--.

UNITED STATES PATENT AND TRADEMARK OFFICE
CERTIFICATE OF CORRECTION

PATENT NO. : 4,700,080

DATED : October 13, 1987

INVENTOR(S) : MASAKI FUKAYA, ET AL.

It is certified that error appears in the above-identified patent and that said Letters Patent is hereby corrected as shown below:

COLUMN 5

Line 64, "refrax" should read --refractive--.
Line 68, "refrax" should read --refractive--.

COLUMN 6

Line 2, "aluminium" should read --aluminum--.

COLUMN 7

Line 17, "example" should read --are examples--.
Line 41, "chroline" should read --chlorine--.
Line 44, "chroline" should read --chlorine--.

COLUMN 8

Line 56, "DAINIPPPON" should read --DAINIPPON--.

COLUMN 9

Line 28, " 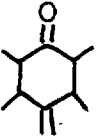 " should read -- 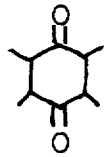 --.

UNITED STATES PATENT AND TRADEMARK OFFICE
CERTIFICATE OF CORRECTION

PATENT NO. : 4,700,080

DATED : October 13, 1987

INVENTOR(S) : MASAKI FUKAYA, ET AL.

It is certified that error appears in the above-identified patent and that said Letters Patent is hereby corrected as shown below:

COLUMN 9 (continued)
   Lines 39-40, " 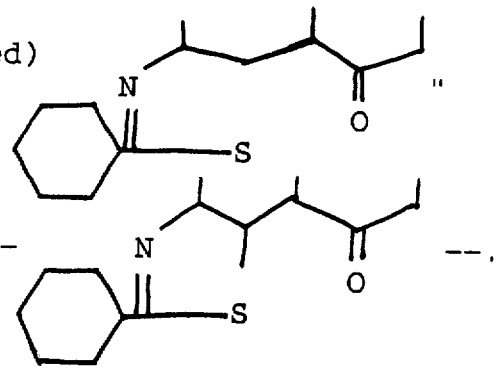 "

should read -- 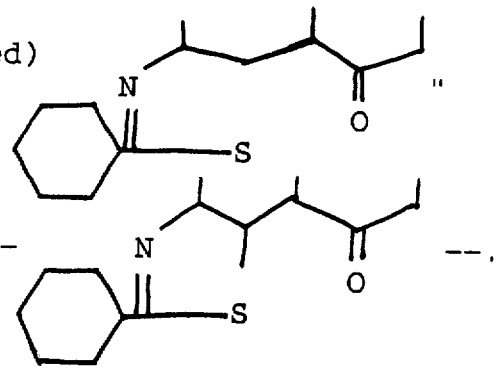 --.

COLUMN 10

Lines 37-40, " 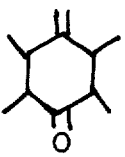 " should read -- 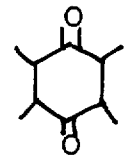 --.

COLUMN 11

Lines 57-60, " 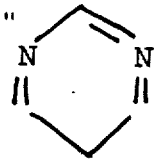 " should read -- 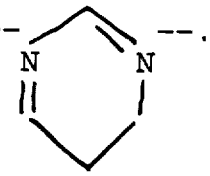 --.

UNITED STATES PATENT AND TRADEMARK OFFICE
CERTIFICATE OF CORRECTION

PATENT NO. : 4,700,080
DATED : October 13, 1987
INVENTOR(S) : MASAKI FUKAYA, ET AL.

It is certified that error appears in the above-identified patent and that said Letters Patent is hereby corrected as shown below:

COLUMN 15

Line 14, "of serial such pixels 10." should read --of such pixels 10.--.
Line 35, "include" should read --includes--.
Lines 56-57, "does not care whether it is" should read --can be either a--.

COLUMN 16

Lines 57-58, "Eastoman" should read --Eastman--.

COLUMN 17

Line 26, "an overlying an" should read --an overlying--.
Line 63, "a" should read --and an--.

COLUMN 18

Line 4, "was" should read --were--.
Lines 9-10, "phtalocyanine" should read --phthalocyanine--.

COLUMN 20

Line 47, "were" should read --was-- (both occurrences).
Line 49, "become" shoud read --became--.
Line 62, "a" should read --as a--.

UNITED STATES PATENT AND TRADEMARK OFFICE
CERTIFICATE OF CORRECTION

PATENT NO. : 4,700,080

DATED : October 13, 1987

INVENTOR(S) : MASAKI FUKAYA, ET AL.

It is certified that error appears in the above-identified patent and that said Letters Patent is hereby corrected as shown below:

COLUMN 21

Line 40, "was" should read --gas--.
    Line 49, "Alminum" should read --Aluminum--.

COLUMN 22

Line 46, "was" should read --were--.

COLUMN 25

Line 20, "farultraviolet" should read --far-ultraviolet--.
    Line 23, "ringe" should read --rinse--.
    Line 48, "vaccum" should read --vacuum--.
    Line 58, "speciallized" should read --specialized--.

COLUMN 26

Line 3, "of" should be deleted.

COLUMN 27

Lines 1-2, "IRGZIN" should read --IRGAZIN--.
    Line 31, "used" should be deleted--.
    Lines 66-67, "perylenetetraxcarboxylic" should read
           --perylenetetracarboxylic--.

COLUMN 28

Line 5, "never" should read --neither--.
    Line 6, "and" should be deleted.

UNITED STATES PATENT AND TRADEMARK OFFICE
CERTIFICATE OF CORRECTION

PATENT NO. : 4,700,080
DATED : October 13, 1987
INVENTOR(S) : MASAKI FUKAYA, ET AL.

It is certified that error appears in the above-identified patent and that said Letters Patent is hereby corrected as shown below:

COLUMN 29

- Line 11, "and II):" should read --and (II):--.
- Line 31, "matter including," should read --matter layer including,--.
- Line 37, "matter including," should read --matter layer including,--.

COLUMN 30

- Line 5, "ormore" should read --or more--.
- Line 42, "matter including," should read --matter layer including,--.
- Line 44, "Phthalocyanine" should read --phthalocyanine--.
- Line 48, "matter including," should read --matter layer including,--.

Signed and Sealed this

Tenth Day of May, 1988

Attest:

DONALD J. QUIGG

Attesting Officer

Commissioner of Patents and Trademarks